United States Patent [19]
Ueda et al.

[11] Patent Number: 5,838,412
[45] Date of Patent: Nov. 17, 1998

[54] LIQUID CRYSTAL DISPLAY DEVICE ASSEMBLED BY FLIP CHIP TECHNOLOGY COMPRISING A FOLDED MULTI-LAYERED FLEXIBLE DRIVING CIRCUIT SUBSTRATE

[75] Inventors: Shiro Ueda; Katsuhiko Shibata; Masumi Sasuga; Norihisa Fukayama; Naoto Kobayashi, all of Mobara, Japan

[73] Assignees: Hitachi, Ltd., Tokyo; Hitachi Device Engineering Co., Ltd., Chiba-ken, both of Japan

[21] Appl. No.: 742,675

[22] Filed: Nov. 4, 1996

[30] Foreign Application Priority Data

Nov. 16, 1995 [JP] Japan .................................. 7-297236
Nov. 16, 1995 [JP] Japan .................................. 7-297242

[51] Int. Cl.[6] .................................................. G02F 1/1345
[52] U.S. Cl. .................................................. 349/150
[58] Field of Search ............................ 349/149, 150, 349/151

[56] References Cited

U.S. PATENT DOCUMENTS

| | | | |
|---|---|---|---|
| 4,643,526 | 2/1987 | Watanabe et al. | 349/151 |
| 5,341,233 | 8/1994 | Tomoike et al. | 349/150 |
| 5,398,128 | 3/1995 | Tajima et al. | 349/150 |
| 5,402,255 | 3/1995 | Nakanishi et al. | 349/150 |
| 5,436,745 | 7/1995 | Voisin et al. | 349/150 |
| 5,608,559 | 3/1997 | Inada et al. | 349/150 |
| 5,726,726 | 3/1998 | Nakanishi | 349/149 |

*Primary Examiner*—William L. Sikes
*Assistant Examiner*—James Dudek
*Attorney, Agent, or Firm*—Antonelli, Terry, Stout & Kraus, LLP

[57] ABSTRACT

To make it possible to prevent disconnection of the wiring on a driving multilayer flexible circuit board when folding the board, to reliably fold the circuit board, to improve the assemblability and the reliability or a backlight member, and to improve the noise resistance in a clip-chip-type liquid crystal display device using the circuit board, one end of a flexible substrate FPC2 is connected to an end of one transparent glass substrate SUB1 constituting a liquid crystal display element, the intermediate portion of the flexible substrate FPC2 is folded nearby the outside of an end side of the substrate SUB1, the other end of the substrate FPC2 is arranged at the lower side of an end of the substrate SUB1, and an end of a film BFI of the flexible substrate FPC2 is formed into a waved pattern along the folding line.

10 Claims, 36 Drawing Sheets

C—C'

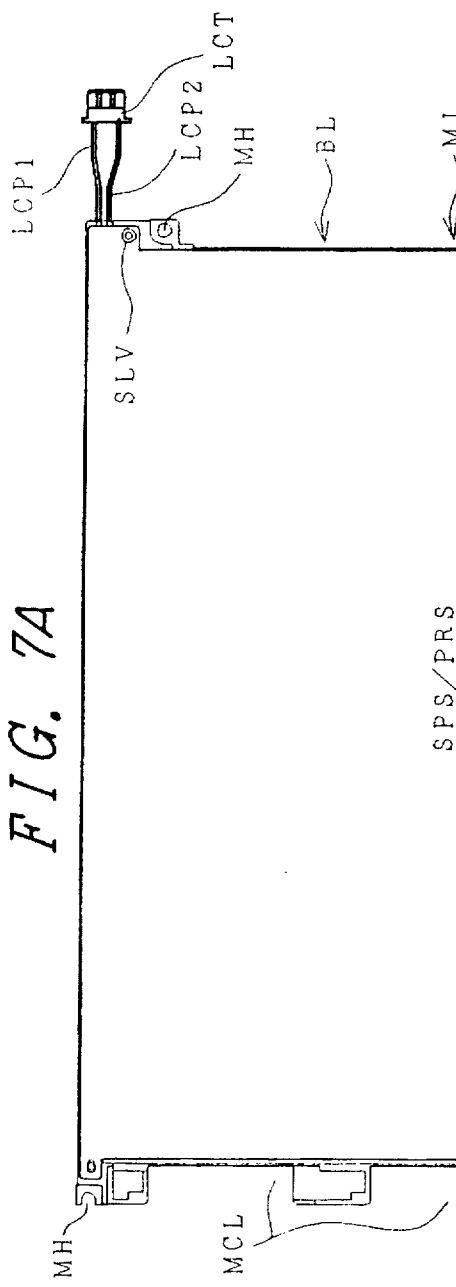
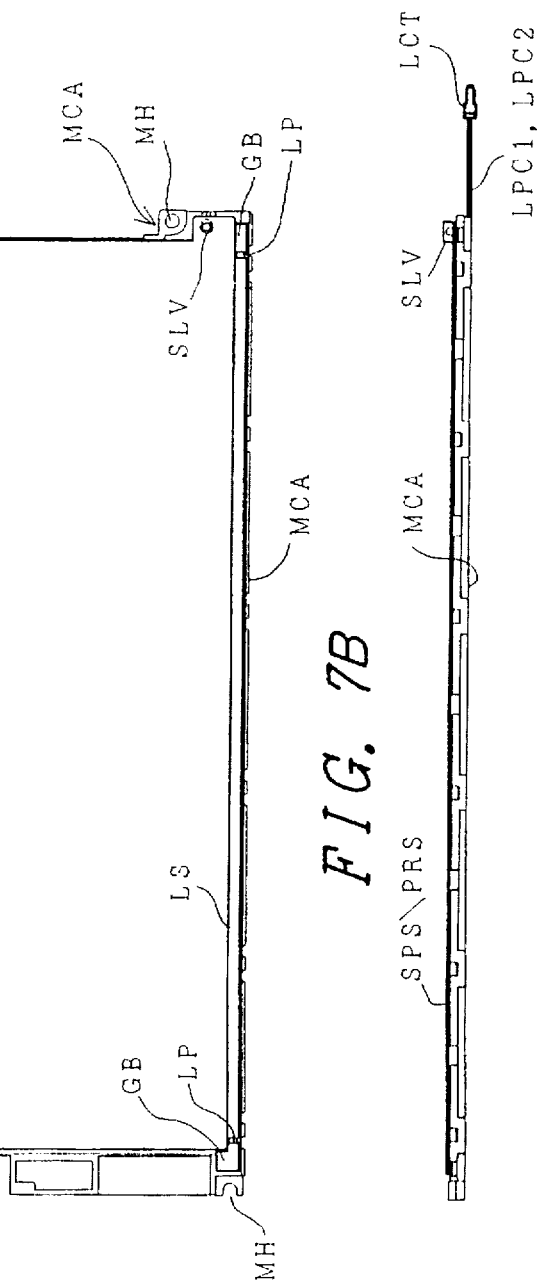
FIG. 7A
FIG. 7B

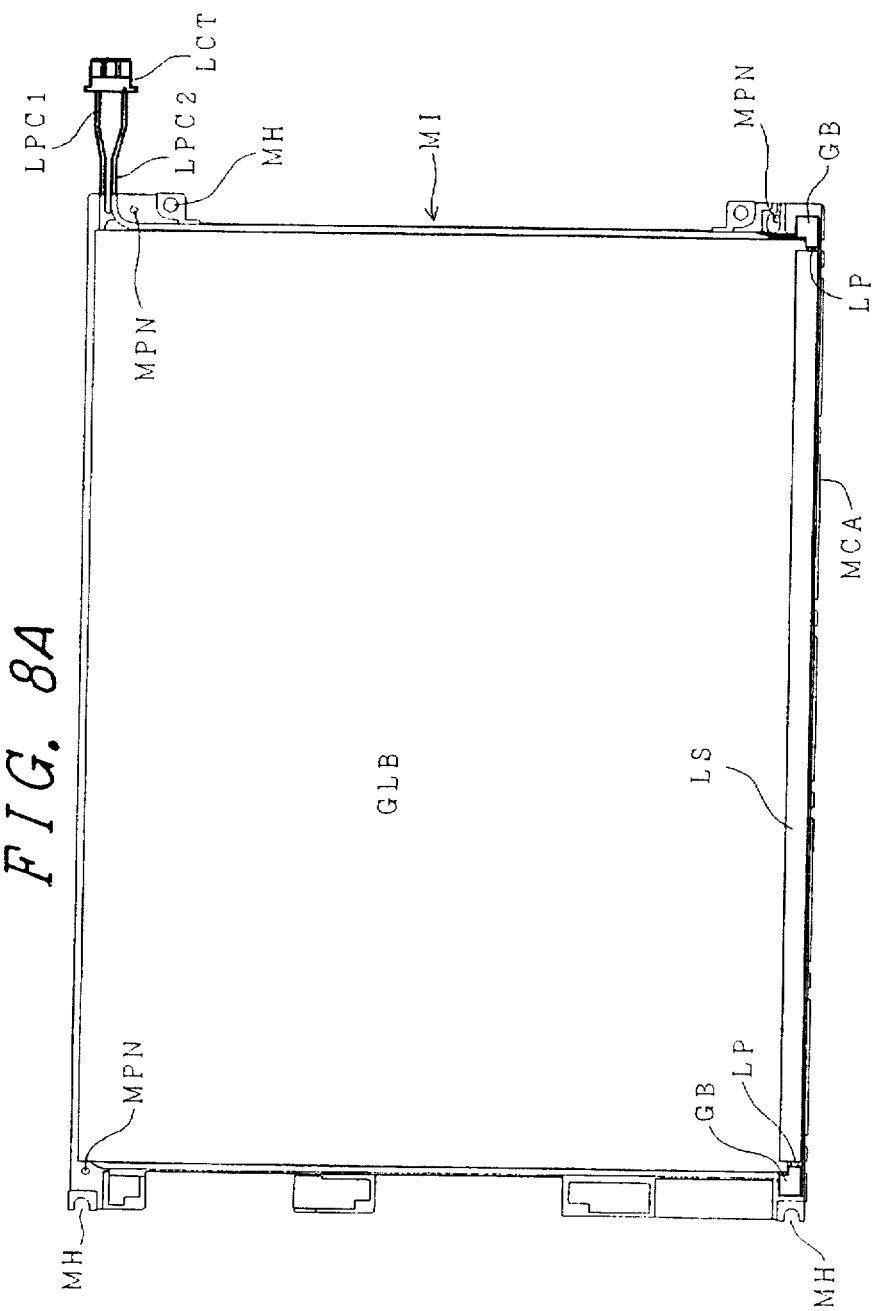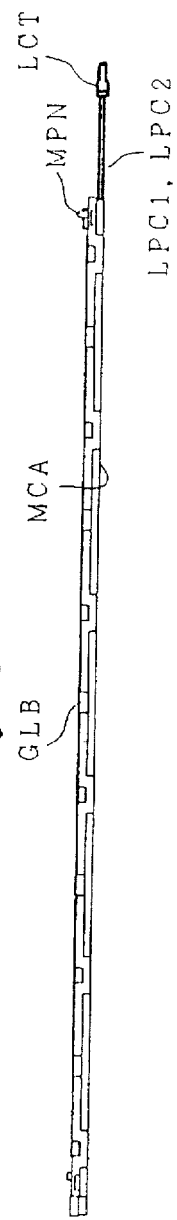

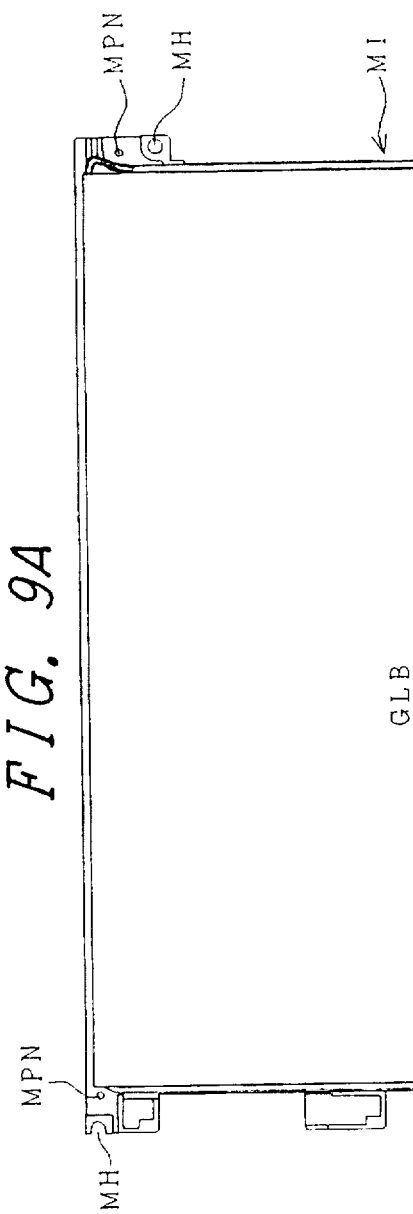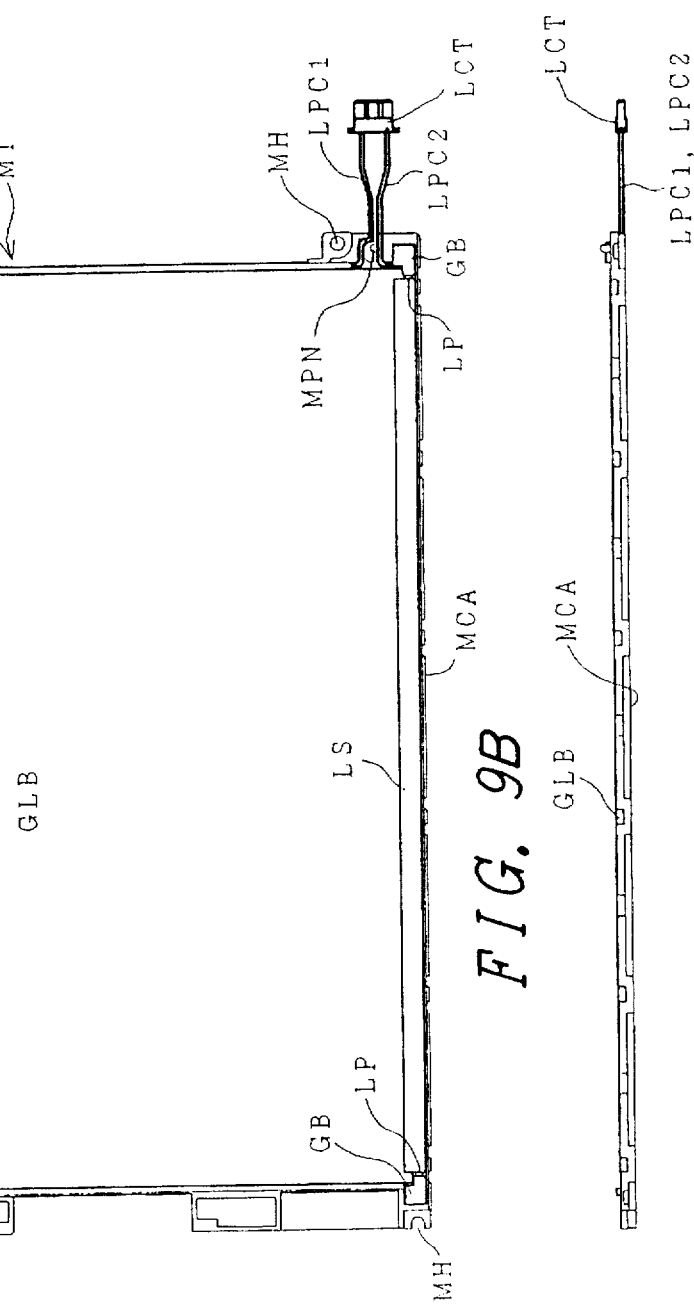
FIG. 9A
FIG. 9B

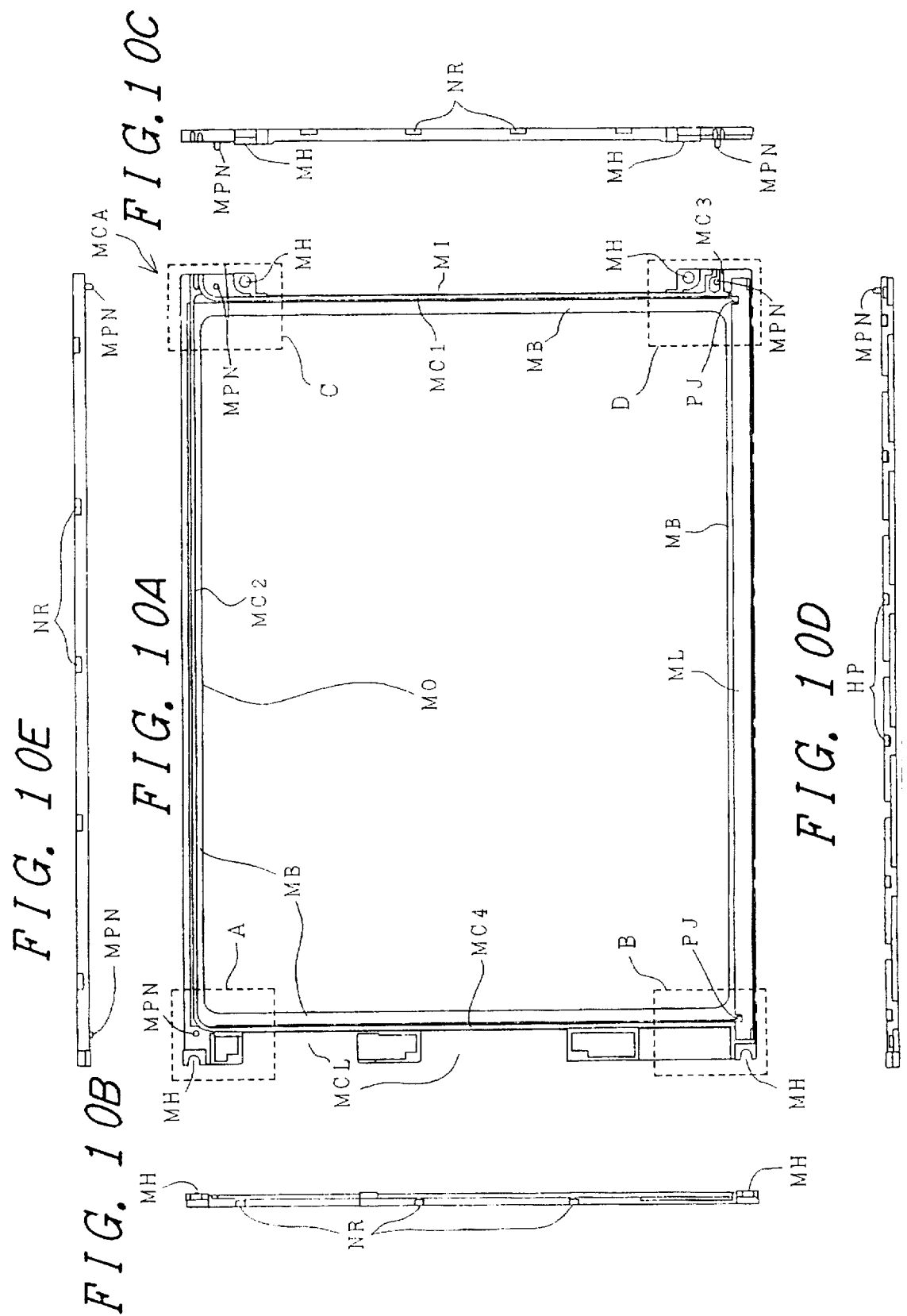

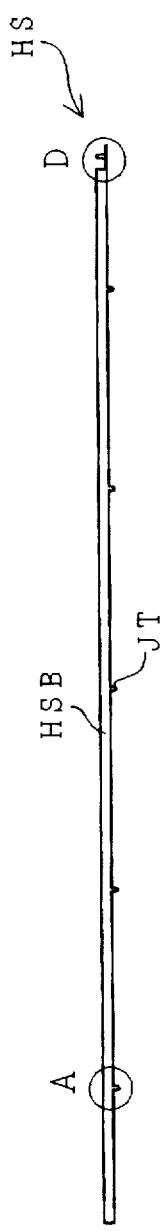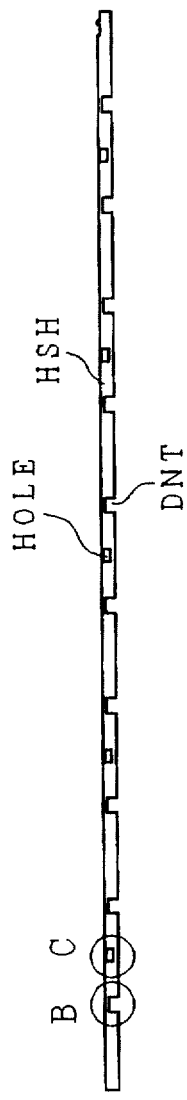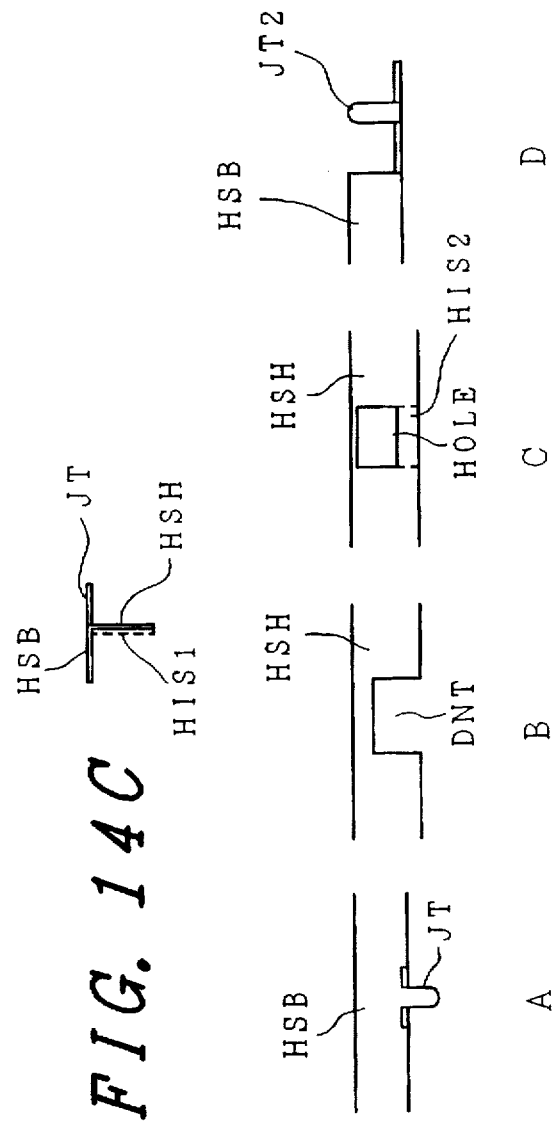
FIG. 14A
FIG. 14B
FIG. 14C
FIG. 14D

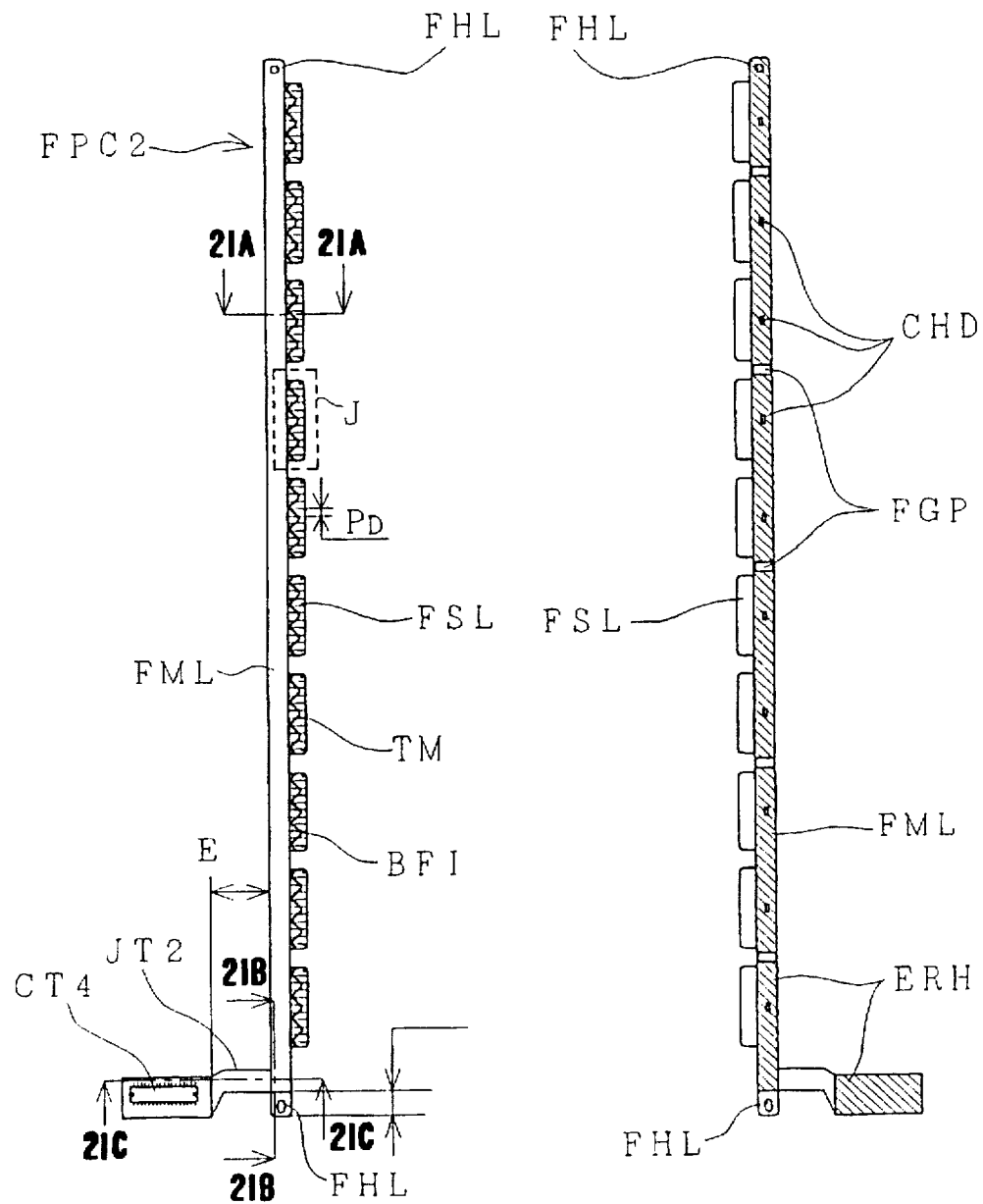

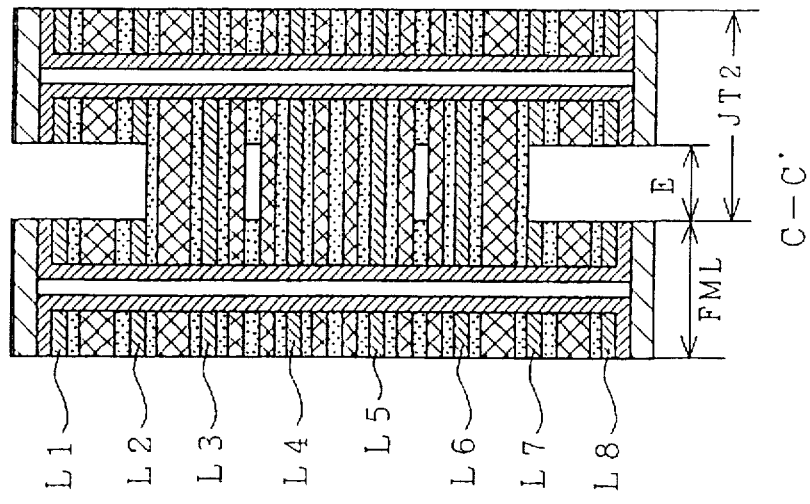
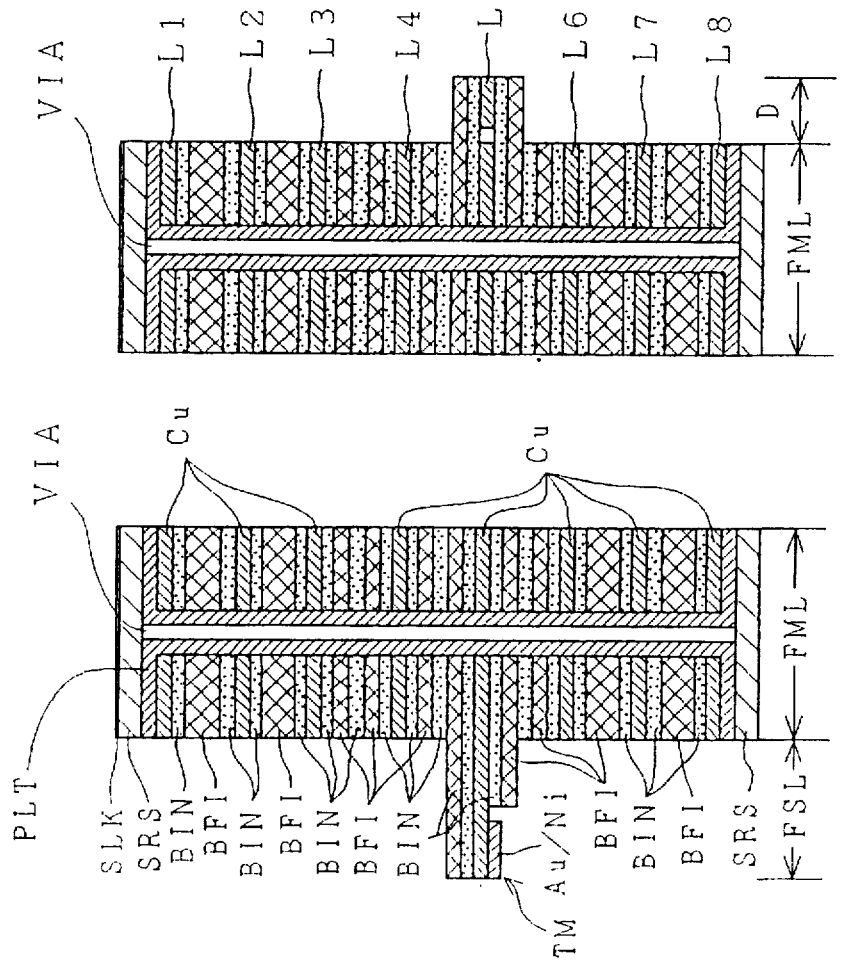

C-C'

D-D'

FIG. 34
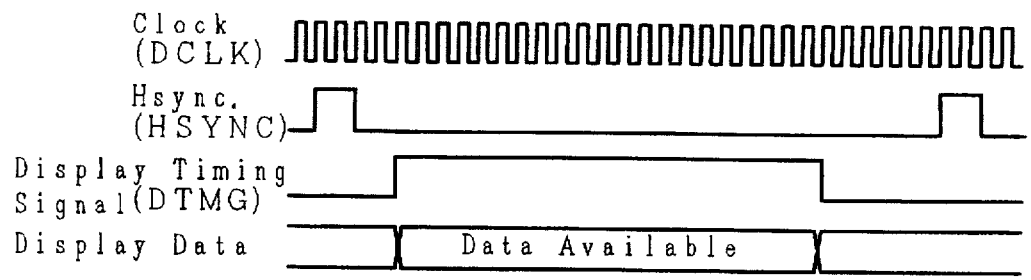
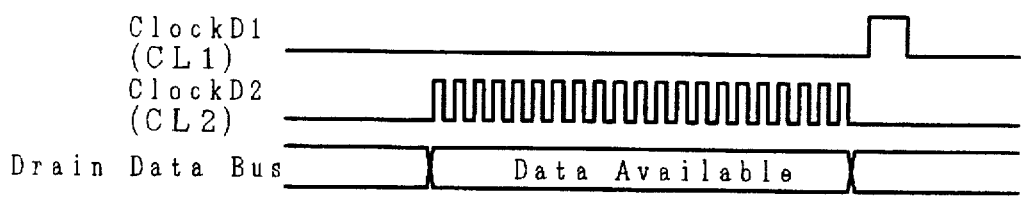
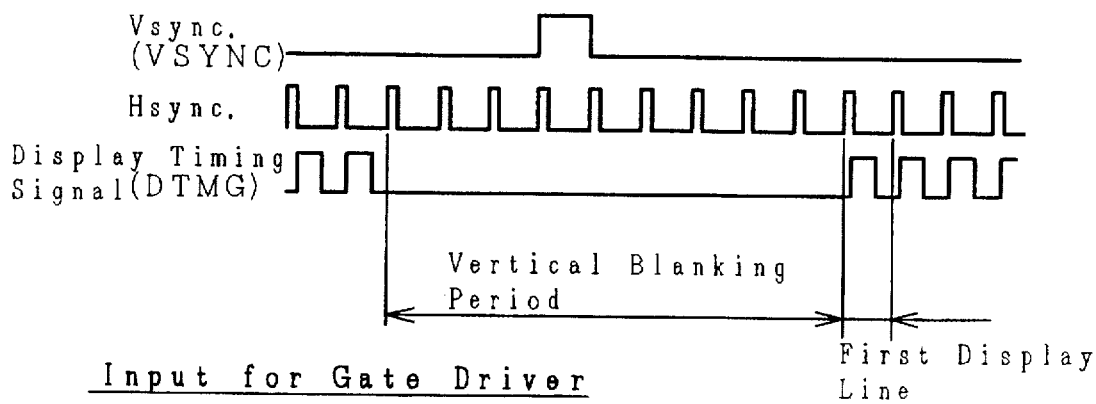
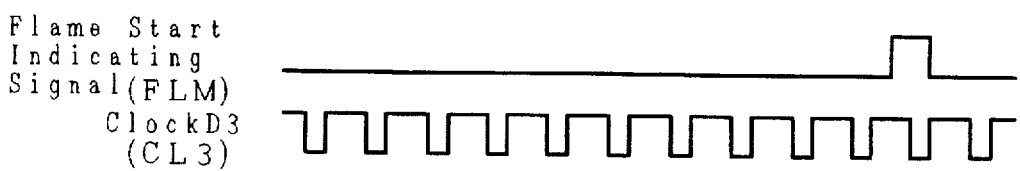

LIQUID CRYSTAL DISPLAY DEVICE ASSEMBLED BY FLIP CHIP TECHNOLOGY COMPRISING A FOLDED MULTI-LAYERED FLEXIBLE DRIVING CIRCUIT SUBSTRATE

BACKGROUND OF THE INVENTION

The present invention relates to a liquid crystal display device having a narrow picture-frame structure, and more particularly to a liquid crystal display device assembled by flip chip technology comprising a folded multi-layered flexible driving circuit substrate.

In the case of a liquid-crystal display element of an active-matrix-type liquid crystal display device, a group of gate lines, extending in the x direction of the liquid-crystal-layer surface on either of two transparent insulating substrates, which are made of glass and arranged so as to face each other through a liquid crystal layer, and arranged in the y direction of the surface in parallel, and a group of drain lines extending in y direction of the surface and arranged in the x direction of the surface in parallel, are formed on the surface.

Each of the regions surrounded by these gate line pair and drain line pair serves as a pixel area and, for example, a thin-film transistor (TFT) and a transparent pixel electrode are formed in each pixel area as a switching device.

When a scanning signal is supplied to a gate line, a thin-film transistor is turned on and a picture signal is supplied to a pixel electrode from a drain line through the turned-on thin-film transistor.

Not only each drain line of the drain line group, but also each gate line of the gate line group, are extended up to the periphery of the transparent insulating substrate to form an input wiring terminal and a drain (video signal) driver and a gate scanning driver connected to the input wiring terminal, that is, a plurality of driving ICs (semiconductor integrated circuits,) constituting these circuits are externally provided at the periphery of the transparent insulating substrate. That is, a plurality of tape carrier packages (TCPs) mounted with these driving ICs are externally provided at the periphery of the substrate.

However, because the transparent insulating substrate has a structure in which TCPs with driving ICs mounted on them are externally provided at the periphery of the substrate, the area of the region (normally referred to as a picture-frame) between the border of the display region formed by the intersection between the gate line group and drain line group of the transparent insulating substrate and the boundary of the outer frame of the case of the liquid crystal display module is increased. This is contrary to the objective of decreasing the outside dimension of the liquid crystal display module.

Therefore, to solve the above problem, that is, to satisfy the objective of increasing the density of the liquid crystal elements and of decreasing the size of the liquid crystal display module as much as possible, a structure has been proposed in which a drain driving IC and a gate scan driving IC are directly mounted on a transparent insulating substrate without using TCP components. This mounting system is called a flip chip system or chip-on-glass (COG) system.

SUMMARY OF THE INVENTION

Recently, notebook-size portable information processing apparatuses, such as personal computers or word processors, into which a liquid crystal display device is incorporated as a display unit, have been in demand, and a decrease of the outside dimension of and an increase in the display region of a liquid crystal display device have been desired in accordance with advancement of the information-intensive society. For example, a structure in which the electric input of a signal is supplied to a driving IC through a multilayer flexible substrate for a flip-chip-type liquid crystal display element in which a driving IC is mounted on either of two superposed transparent insulating substrates as means for realizing a narrow picture-frame liquid crystal display device was previously proposed by the same applicant, though it is not a generally-known example (Japanese Patent Application No. 256426/1994).

In the case of the above structure, one end of the multilayer flexible substrate is electrically and mechanically connected to the surface of the input wiring terminal at the end of the substrate by an anisotropic conductive film, the intermediate portion of the substrate is folded, and the other end of the substrate is folded to the opposite side of the substrate on which the driving IC is mounted in order to decrease the dimension of the picture-frame portion of a liquid crystal display module.

However, the joint with the transparent insulating substrate of the multilayer flexible substrate is a two-layer structure formed of a base film layer and a conductor layer of wiring, and the folded portion is a three-layer structure formed of a base film layer, a conductor layer of wiring, and a cover film layer. Therefore, there is a problem in that stress is concentrated on the portion between the two-layer structure and the three-layer structure depending on the hardness of the cover film and, thereby, this portion is bent like a dogleg, and so the wiring of the multilayer flexible substrate extending in a direction tranverse to the folding line may become disconnected. Therefore, the reliability is low.

Moreover, as a liquid crystal display element has a higher resolution, the wiring of a driver substrate tends to be made at a higher density and electronic components tend to be mounted at a higher density. However, also in the case of a multilayer circuit board, the area allowed for wiring decreases and it is difficult to form a ground line sufficiently widely. Therefore, a problem occurs in that a stable display quality is not obtained due to noise incoming from the outside of the device or noise generated inside or due to unnecessary radiated radio waves causing EMI (electromagnetic interference). Because the resolution has been rising year by year and the driving frequency has been increasing, noise prevention has become an important problem.

Moreover, an interface circuit board on which a power supply circuit for obtaining a plurality of stabilized power supplies voltage-divided from one power supply and a circuit for converting display information sent from a host (host processing circuit) to the information for the TFT liquid crystal display device are mounted has been arranged outside one side of the liquid crystal display element, and therefore, this has impeded the reduction of the size of the picture-frame portion.

Moreover, in the case of a conventional liquid crystal display device, a fluorescent tube is arranged on the upside or right or left side of a display block and wiring up to the inverter power-supply circuit for driving the fluorescent tube is arranged outside the lateral sides of a light guide. Therefore, when the inverter power-supply circuit is not arranged on the display block side of an information processing apparatus into which the liquid crystal display device is incorporated as a display block, but it is arranged on the keyboard side, a problem arises in that the wiring length of the fluorescent tube increases and the starting characteristic of the fluorescent tube is deteriorated.

Moreover, a diffusion sheet and one or two prism sheets arranged above a light guide hitherto have been fixed by a double-sided adhesive tape provided along the edge of one side of a bottom case for housing and holding a backlight, such as a light guide. Therefore, when setting a backlight sheet, such as a diffusion sheet or a prism sheet, the operability is impaired and it is difficult to accurately and easily position the sheet. Moreover, if defective sheets are found, them is difficult to remove it and reuse the device.

Furthermore, the corners of a conventional light guide are disposed at a right-angle and the light-guiding-body-corner support portion (positioning portion) of the bottom case for housing and supporting the light guide is also disposed at a right-angle. Therefore, the light guide is weak against a force F in the side direction of the body (see FIG. 12B) and a problem arises in that the support portion of the bottom case will be damaged if the light guide, which is a heavy member, is moved in the liquid crystal display device due to vibrations or impacts.

A first problem to be solved by the present invention is to provide a liquid crystal display device capable of preventing disconnection of a flexible substrate for signal input, whose one end is connected to one end face of a transparent insulating substrate of a liquid crystal display element and whose other end is folded under the other end face of the substrate for improving the reliability.

The second problem to be solved by the present invention is to provide a liquid crystal display device having a stable ground line, removing the influence of noises incoming from the outside or generated inside, making it possible to obtain stable display quality, preventing unwanted radiated radio waves causing EMI, and moreover being suitable for reduction in thickness, and in size, and increase in screen size.

The third problem to be solved by the present invention is to decrease the width of the picture-frame portion.

The fourth problem to be solved by the present invention is to improve the starting characteristic of the fluorescent tube by decreasing the wiring length of the fluorescent tube.

The fifth problem to be solved by the present invention is to improve the operability, accurately and easily perform positioning when setting sheets of the backlight, and to facilitate the reuse.

The sixth problem to be solved by the present invention is to prevent damage to the support body of the light guide corner of the case for housing and holding the light guide of the backlight.

To solve the first problem, first means is provided which comprises a liquid crystal display device having a flip-chip-type liquid crystal display element with a driving IC chip mounted on the surface of one of two transparent insulating substrates superposed through a liquid crystal layer and a flexible circuit board which is connected to the surface of the other of the two substrates, whose intermediate portion is folded, and whose other end is arranged under the other surface of the one substrate end, in which an end of a film of the flexible circuit board is formed into a shape having waved or serrated crests and troughs in the folding line direction.

Moreover, to solve the second problem, second means is provided which comprises a liquid crystal display device having a liquid crystal display element, a driver circuit board, and a metallic shielding case, in which a slender metallic thin plate electrically connecting the ground line of the driver circuit board with the metallic shielding case and provided separately from the shielding case is further included.

Furthermore, to solve the third problem, third means is provided which comprises a liquid crystal display device having a flip-chip-type liquid crystal display element with a driving IC chip mounted on the surface of one of two transparent insulating substrates superposed through a liquid crystal layer, a first interface circuit substrate for supplying a source voltage and image data information to the liquid crystal display element, and a second flexible interface circuit board connected to the surface of the other of the two substrates, in which a part of the first circuit board is superposed on the liquid crystal display element and the second circuit board is superposed on the first circuit board to electrically connect them to each other when viewed from the direction vertical to the substrate surface.

Furthermore, to solve the fourth problem, fourth means is provided which comprises a liquid crystal display device having a light guide arranged under a liquid crystal display element and a linear light source arranged at one end face of the light guide, in which the linear light source is arranged along the long side of the liquid crystal display element and nearby the keyboard block of an information processing apparatus into which the liquid crystal display device is incorporated or a part of a lamp cable of a fluorescent tube is arranged under the light guide.

Furthermore, to solve the fifth problem, fifth means is provided which comprises a liquid crystal display device having at least one optical sheet arranged above or under a light guide, in which a small hole is made in an end area of the optical sheet and the small hole is made to penetrate a projection portion formed on a member separate from the optical sheet to hold the optical sheet.

Furthermore, to solve the sixth problem, sixth means is provided which is characterized in that at least one corner of the light guide arranged under the liquid crystal display element is chamfered to form a first slope and also a second slope is formed at the support portion of the bottom case corresponding to the first slope.

According to the first means, because the end of the film is formed into a shape having waved or serrated crests and troughs in the folding line direction in the multilayer flexible substrate, it is possible to prevent stresses from concentrating on the end of the film at the folded portion, to provide a preferable curvature for the folded portion, to prevent disconnection from occurring, and to improve the reliability.

According to the second means, because the ground line of the driver circuit board is electrically connected with the metallic shielding case having a sufficiently low impedance through the metallic thin plate, it is possible to supply a stable ground line and enhance the ground line in a high-frequency region. Therefore, it is possible to remove the influence of noise incoming from the outside or generated inside, to obtain a stable display screen, and to prevent harmful radiated radio waves causing EMI from occurring. Moreover, the operability of the connection is improved compared to the prior art where a pawl integrally formed by cutting a part of the front or side of a metallic shielding case is bent and the case is connected with the ground line of a circuit by the pawl, in that the necessary space in the folding direction of the pawl can be eliminated, and the thickness of the picture-frame portion and that of the device can be decreased.

According to the third and fourth means, the width of the picture-frame portion can be decreased.

According to the fourth means, because the wiring length of the fluorescent tube can be decreased, it is possible to decrease the impedance causing noise and waveform change and improve the starting characteristic of the fluorescent tube.

According to the fifth means, because the positions of sheets of the backlight are automatically determined by combining the projecting portion and the small hole, positioning can be performed accurately and easily. Moreover, because sheets can easily be set or removed one by one, it is possible to replace only a defective sheet and easily effect reuse.

According to the sixth means, because a slope is formed on the corner of the light guide and another slope having the shape corresponding to the slope on the light guide is also formed on the support portion of the bottom case, a force acting on the support portion of the case is decomposed into two directional components (see FIG. 12C) and the force as two component forces can be reduced though they are equal as a resultant force, and therefore it is possible to prevent damage on the case support portion and the reliability is improved.

The foregoing and other objects, advantages, manner of operation and novel features of the present invention will be understood from the following detailed description when read in connection with the accompanying drawings.

BRIEF DESCRIPTION OF THE DRAWINGS

FIGS. 7A–7B show a top plan view and a front side view of a backlight BL;

FIGS. 8A–8B show a top plan view and a front side view of the backlight BL in FIG. 7 from which two prism sheets PRS and a diffusion sheet SRS are removed;

FIGS. 9A–9B show a top plan view and a front side view of a backlight BL similar to those of FIG. 8, showing another structure;

FIGS. 10A–10E show a top plan view, a front side view, a rear side view, a right side view, and a left side view of a bottom case MCA;

FIG. 14A is a front side view of a metallic thin plate HS for taking frame ground (hereafter referred to as frame ground), FIG. 14B is a back view, FIG. 14C is a lateral side view, and FIG. 14D is a view of the portions A, B, C, and D of FIG. 14A and 14B;

FIG. 15A is a back (bottom) view of a multilayer flexible substrate FPC2 for driving a drain driver and FIG. 15B is a front (top) view of the substrate FPC2;

FIG. 21A is a sectional view of the substrate FPC2 of FIG. 15A, taken along the line 21A—21A of FIG. 15A, FIG. 21B is a sectional view of the PPC2 in FIG. 15A, taken along the line, and FIG. 21C is a sectional view of the FPC2 of FIG. 15A, taken along the line 21C—21C of FIG. 15A;

FIG. 34 is an a diagram showing timing charts of display data input to the display controller from the body computer and the signal output from the display controller to a gate and a drain in a TFT liquid crystal display module;

DESCRIPTION OF THE PREFERRED EMBODIMENTS

Figure 1:
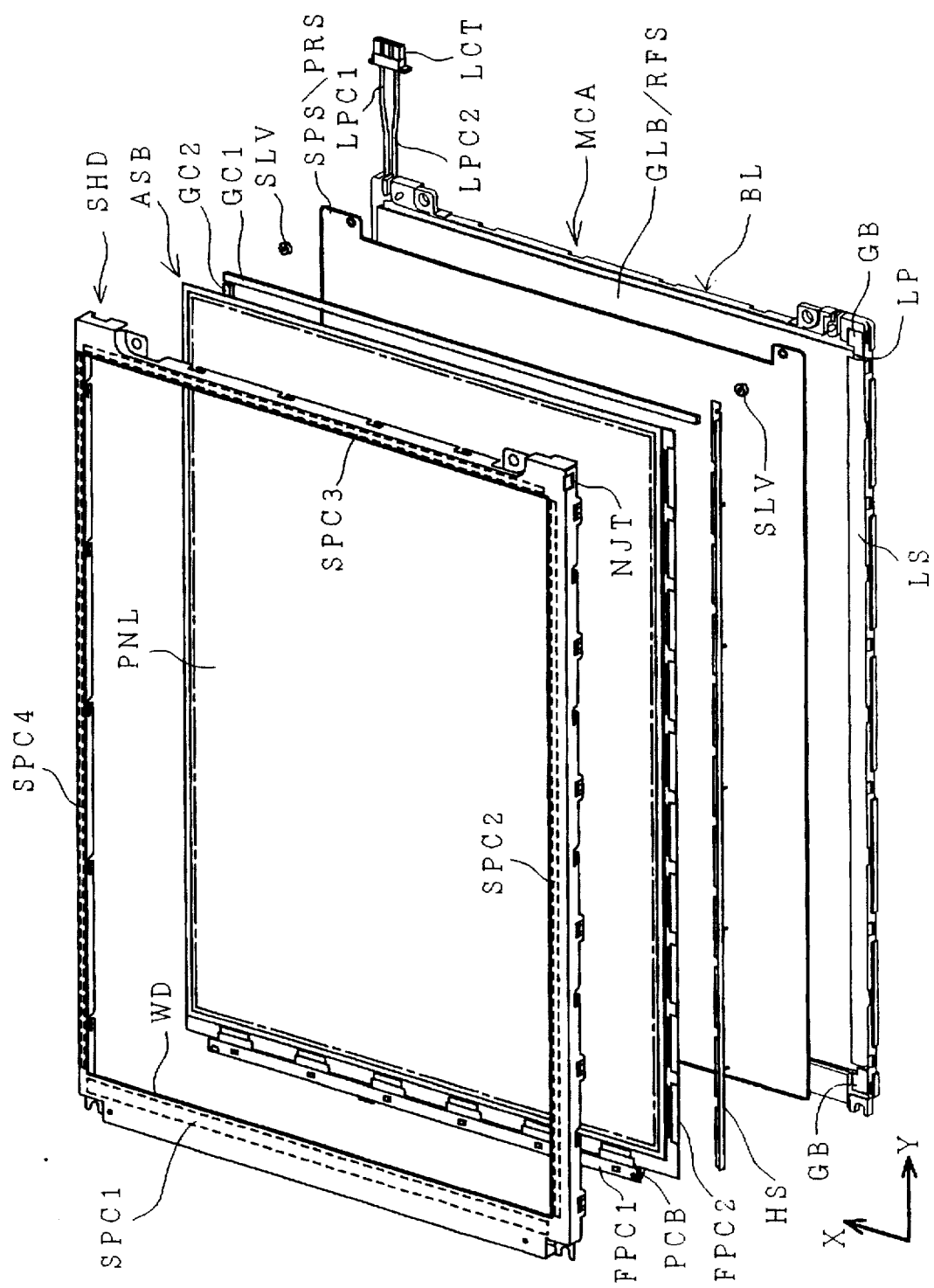
FIG. 1 is an exploded perspective view of a liquid crystal display module of the type to which the present invention can be applied.

Embodiments of the present invention will be described below with reference to the accompanying drawings. In the drawings described below, components having the same function are denoted by the same symbol and their repetitive description will be omitted.

<<Overall structure of liquid crystal display module>>

FIG. 1 is a perspective view of a liquid crystal display module MDL.

In FIG. 1, symbol SHD denotes a shielding case (also referred to as a metal frame) composed of a metallic plate, WD denotes a display window, SPC1 to SPC4 denote insulating spacers, FPC1 and FPC2 denote multilayer flexible circuit boards (FPC1 is a gate-side circuit board and FPC2 is a drain-side circuit board), PCB denotes an interface circuit board, ASB denotes an assembled liquid crystal display element having a driver substrate, PNL denotes a liquid crystal display element with a driving IC mounted on one of two superposed transparent insulating substrates (also referred to as a liquid crystal display panel), GC1 and GC2 denote rubber cushions, PRS denotes prism sheets (two sheets), SPS denotes a diffusion sheet, GLB denotes a light guide plate, RFS denotes a reflection sheet, MCA denotes a bottom case (mold case), LP denotes a fluorescent tube, LPC denotes a lamp cable, LCT denotes a connector for connection with an inverter, and GB denotes a rubber bush for supporting the fluorescent tube LP. Each member is superposed vertically as shown in FIG. 1 and thereby, the liquid crystal display module MDL is assembled.

Figure 2:
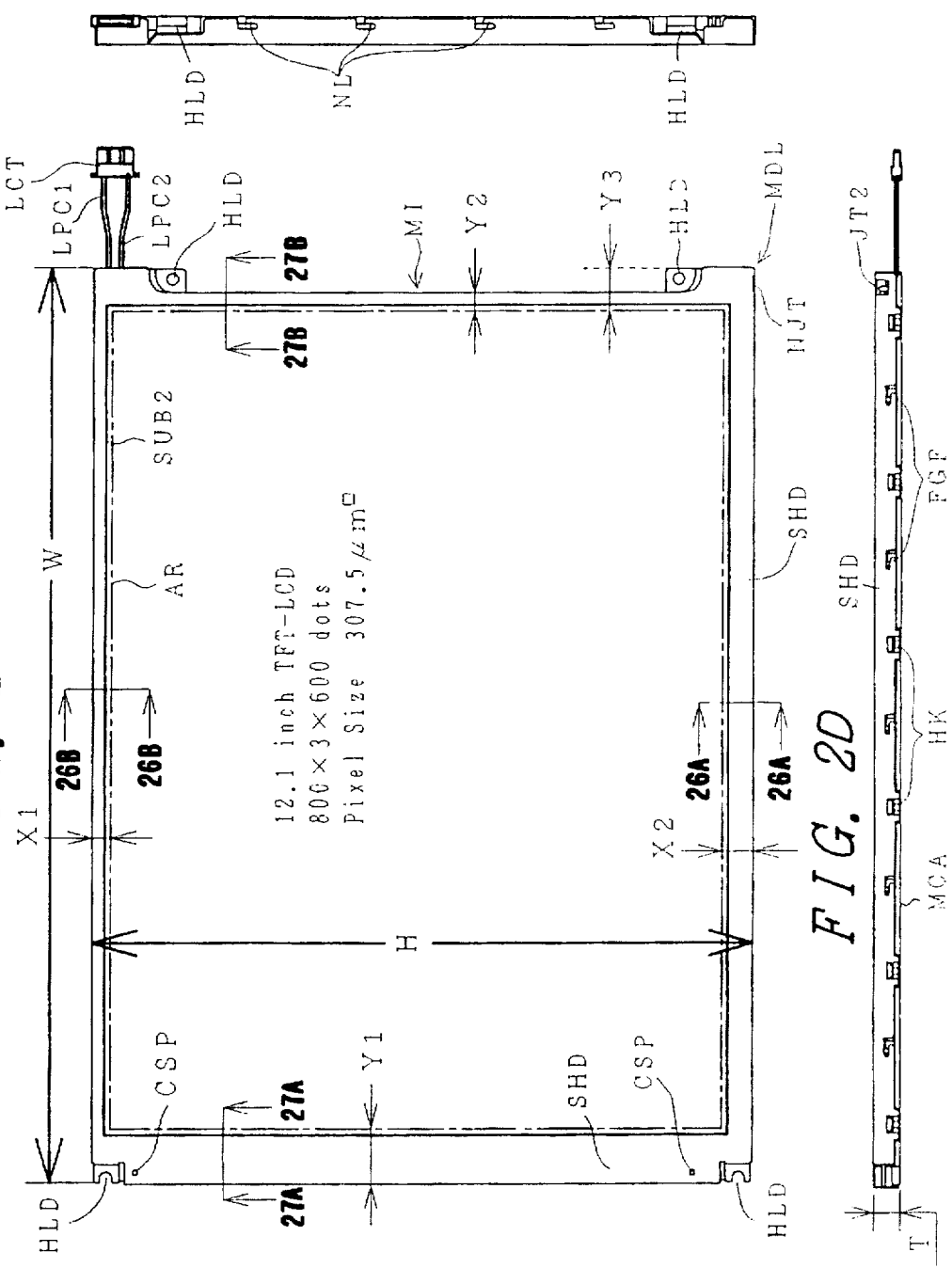
FIGS. 2A–2D show a top plan view, a front side view, a right side view, and a left side view of an assembled liquid crystal display module when viewed from the display side of the liquid crystal display module.

FIG. 2 is a view showing an assembled liquid crystal display module MDL, which is a front view, front side view, right side view, and left side view when viewed from the surface side (that is, top display side) of the liquid crystal display element PNL.

Figure 3:
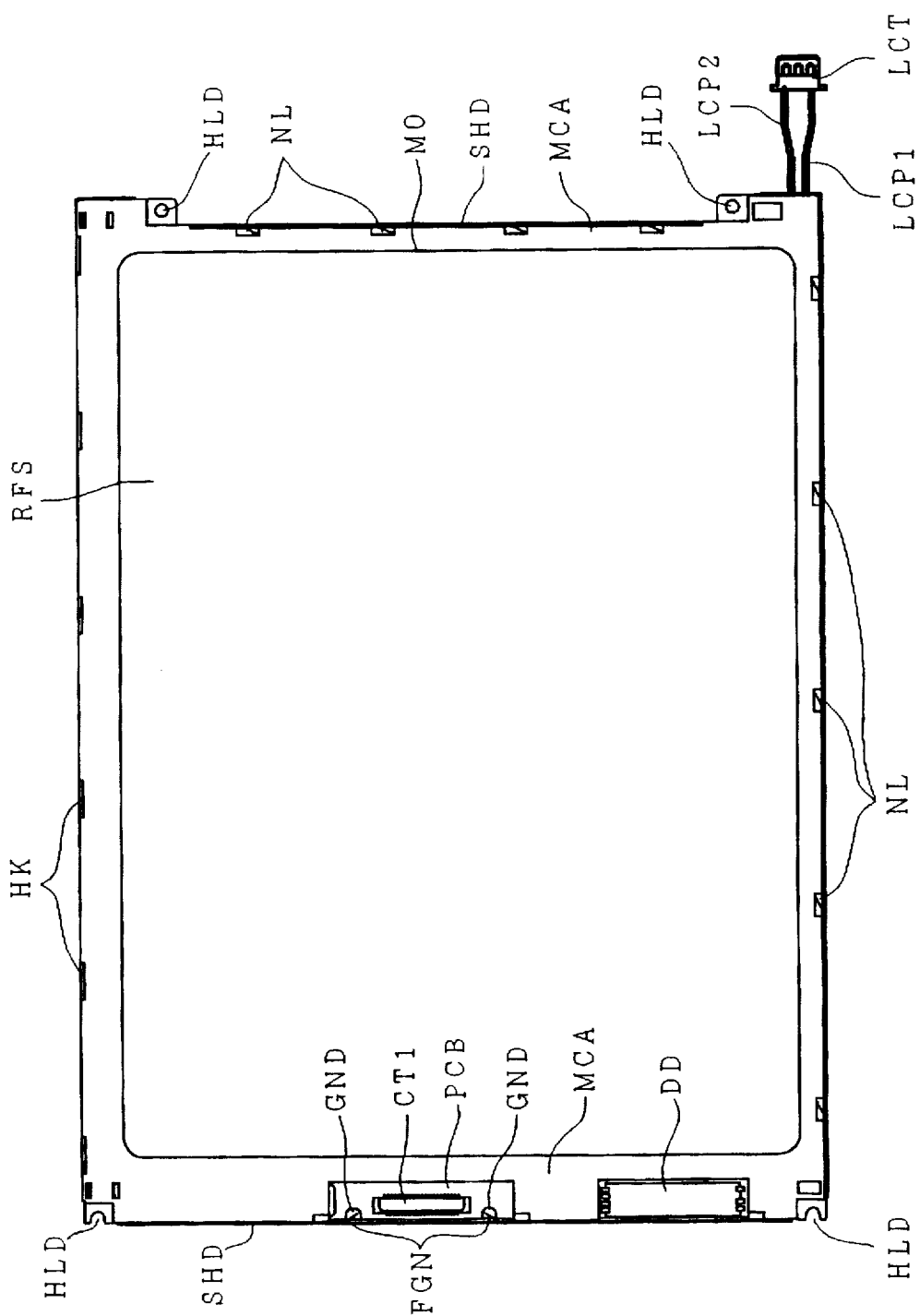
FIG. 3 is a bottom view of an assembled liquid crystal display module.

FIG. 3 is an illustration showing the assembled liquid crystal display module MDL, which is a back view when viewed from the back (bottom) of the liquid crystal display element.

The module MDL has two types of housing and holding members, i.e., a bottom case MCA and a shielding case SHD.

HLD denotes four mounting holes formed to mount the module MDL on an information processing apparatus, such as a personal computer or word processor, as a display block. The mounting holes HLD of the shielding case SHD are formed at the positions corresponding to mounting holes MH (see FIGS. 10 and 11) of the bottom case MCA (see FIG. 2) to secure and mount the module MDL to the information processing apparatus by passing screws through the mounting holes of the both cases MCA and SHD.

In the module MDL, an inverter MI for a backlight is arranged on an MI portion to supply electric power to a backlight BL through a lamp cable LPC. Signals from a body computer (host) and the necessary electric power are supplied to the controller section and power supply section of the liquid crystal display module MDL through an interface connector CT1 located at the back of the module.

In FIG. 2, for the outside maximum dimensions of the shielding case SHD of the module MDL, the length W in the lateral (long side) direction is 275.5±0.5 mm, the length H in the longitudinal (short side) direction is 199±0.5 mm, the thickness T is 8±0.5 mm, and the width X1 of the top picture-frame portion of the shielding case SHD is 5.25 mm, the width X2 of the bottom picture-frame portion thereof is 9.25 mm, the width Y1 of the left picture-frame portion thereof is 16.5 mm, the width Y2 of the right picture-frame portion thereof is 5.5 mm, and the width Y3 of a wide portion nearby the lower corner of the right picture-frame portion is 7.5 mm when they are measured from an effective pixel area AR.

Figure 29:
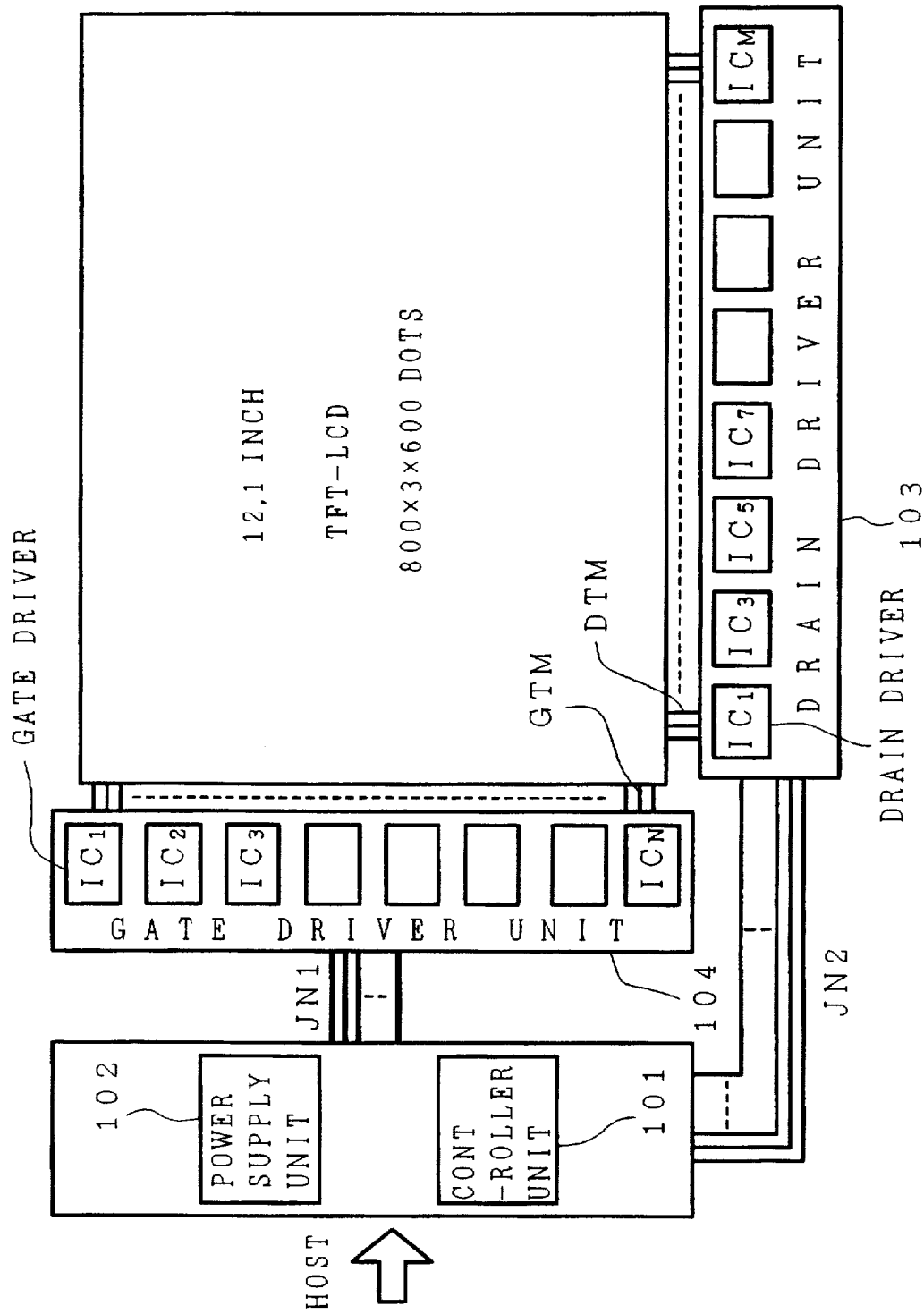
FIG. 29 is a block diagram showing a liquid crystal display element of a liquid crystal display module and circuits arranged around the liquid crystal display element.
Figure 30:
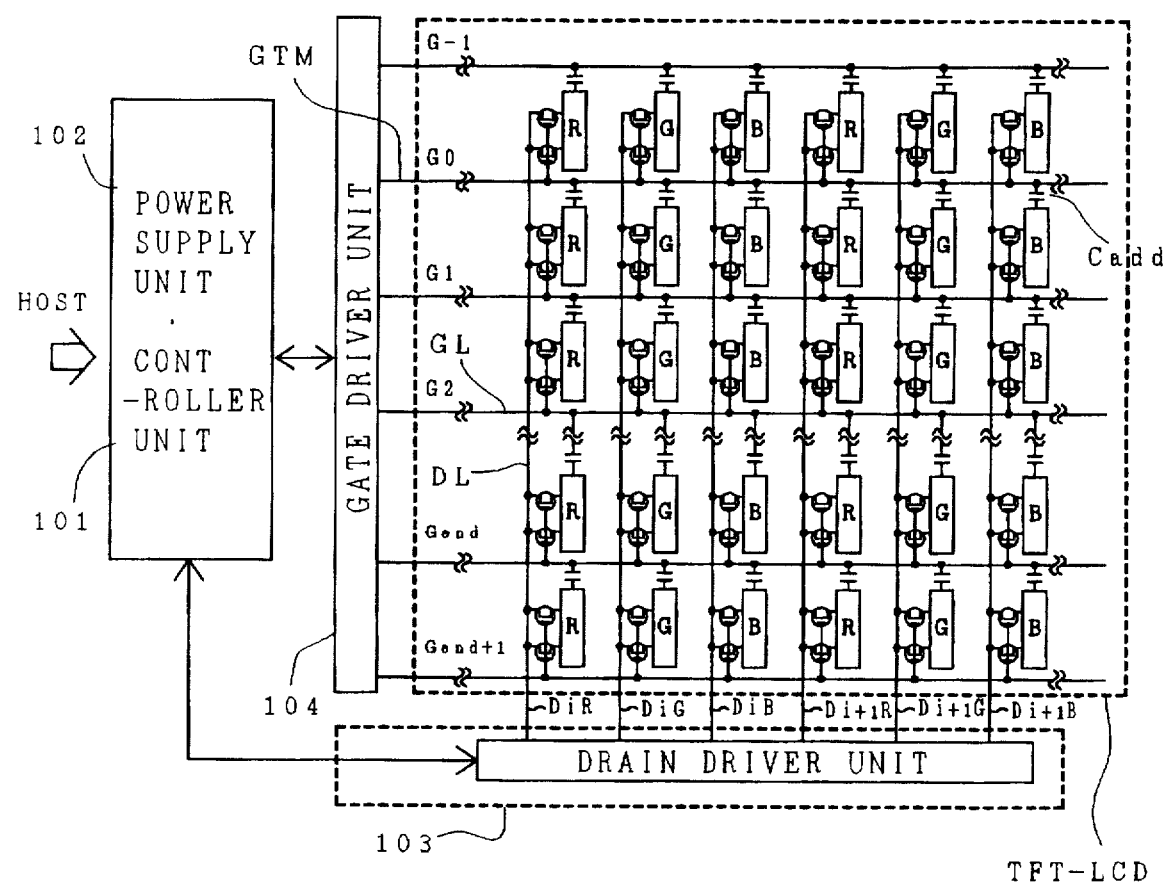
FIG. 30 is a block diagram showing an equivalent circuit of a TFT liquid crystal display module.

FIGS. 29 and 30 are block diagrams showing the TFT liquid crystal display element of the TFT liquid crystal display module corresponding to the embodiment shown in FIG. 1 and the circuits arranged on the outer periphery of the element.

In this embodiment, drain drivers $IC_1$ to $IC_M$ and gate drivers $IC_1$ to $IC_N$ are chip-on-glass-mounted (COG-mounted) by means of a drain-side lead DTM, a gate-side lead GTM, and an anisotropic conductive film or ultraviolet-curing resin formed on one of the transparent insulating substrates of the liquid crystal display element.

In this embodiment, the drain and gate drivers are adapted to a liquid crystal display element having effective dots of 800×3×600 conforming to the XGA specification (longitudinal and lateral pixel pitches are 307.5 μm).

Therefore, ten drain driver ICs (M=10) with 240 outputs are COG-mounted on one long side of the liquid crystal display element and six gate drivers (N=6) with 101 outputs and 100 outputs are COG-mounted on one short side of the element.

A drain driver section 103 is arranged on the lower side of the liquid crystal display element and moreover, a gate driver section 104, a controller section 101, and a power supply section 102 are arranged on the left side of the element. The controller section 101 and power supply section 102, the drain driver section 103, and the gate driver section 104 are connected to each other through electrical connection means JN1 and JN2.

Moreover, the controller section 101 and the power supply section 102 are arranged on the back of the gate driver section 104.

Specific structures of components are shown in FIGS. 2 to 28 and each member will be described below in detail.

<<Metallic shielding case SHD>>

The top, front side, right side, and left side of the shielding case SHD are shown in FIG. 2 and a perspective view of the shielding case SHD when viewed from the diagonally upper side is shown in FIG. 1.

The shield case (metal frame) SHD is fabricated using punching and bending a metallic plate by a press technique. Symbol WD denotes an aperture for exposing the liquid crystal display PNL to the visual field, which will be hereafter referred to as display window.

Symbol NL denotes pawls (total of 12 pawls) for fixing the shielding case SHD and the bottom case MCA and HK denotes fixing hooks (total of 6 hooks), which are integrated with the shielding case SHD. The fixing pawls NL shown in FIGS. 1 and 2 are not bent yet, but will be respectively bent inward (bent state is shown in FIG. 3) and inserted into quadrangle fixing recesses NR formed in the bottom case MCA (see each side view in FIG. 10) after housing the liquid crystal display element ASB having a driver in the shielding case SHD by holding the spacer SPC therebetween. Each fixing hook HK is fitted to a fixing protrusion HP formed on the bottom case MCA (see the side view in FIG. 10). Thereby, the shielding case SHD for holding and housing the liquid crystal display element ASB having a driver and the bottom case MCA for holding and housing the light guide plate GLB and the fluorescent tube LP are firmly fixed.

Moreover, thin slender rectangular rubber cushions GC1 and GC2 (also referred to as rubber spacers: see FIG. 1) are provided at the periphery of two sides of the substrates SUB1 having no input wiring terminal under the liquid crystal display element PNL. Furthermore, because the fixing pawls NL and the fixing hooks HK can easily be released (only the bent fixing pawls NL need be straightened to release the fixing hooks NK) and therefore the two members can easily be disassembled and reassembled, repairs easily made and the fluorescent tube LP of the backlight BL easily replaced. Furthermore, in this embodiment, because one side is mainly fixed by the fixing hooks HK and the other side faced is fixed by the fixing pawls NL, it is possible to disassemble the two members merely by releasing some fixing pawls NL without removing all fixing pawls NL. Therefore, repair and replacement of the backlight are easy.

CSP are through-holes which are used to accurately set the relative position between the shielding case SHD and other components by inserting fixed and raised pins into the through-holes CSP of the shielding case SHD at the time of fabrication. Both sides of each insulator of the insulating spacers SPC1 to SPC4 are coated with an adhesive material. Therefore, it is possible to firmly fix the shielding case SHD and the liquid crystal display element ASB with driver substrates by keeping the gap by the insulating spacers. Moreover, when mounting the module MDL on an application product such as a personal computer, it is also possible to use the through-holes CSP as a reference for positioning.

<<Insulating spacer>>

As shown in FIG. 1 and FIGS. 26 to 28, the insulating spacers SPC not only ensure insulation between the shielding case SHD and the liquid crystal display element ASB having a driver, but also ensure the positional accuracy with the shielding case SHD and secure the liquid crystal display element ASB having a driver to the shielding case SHD.

<<Multilayer flexible substrates FPC1 and FPC2>>

Figure 4:
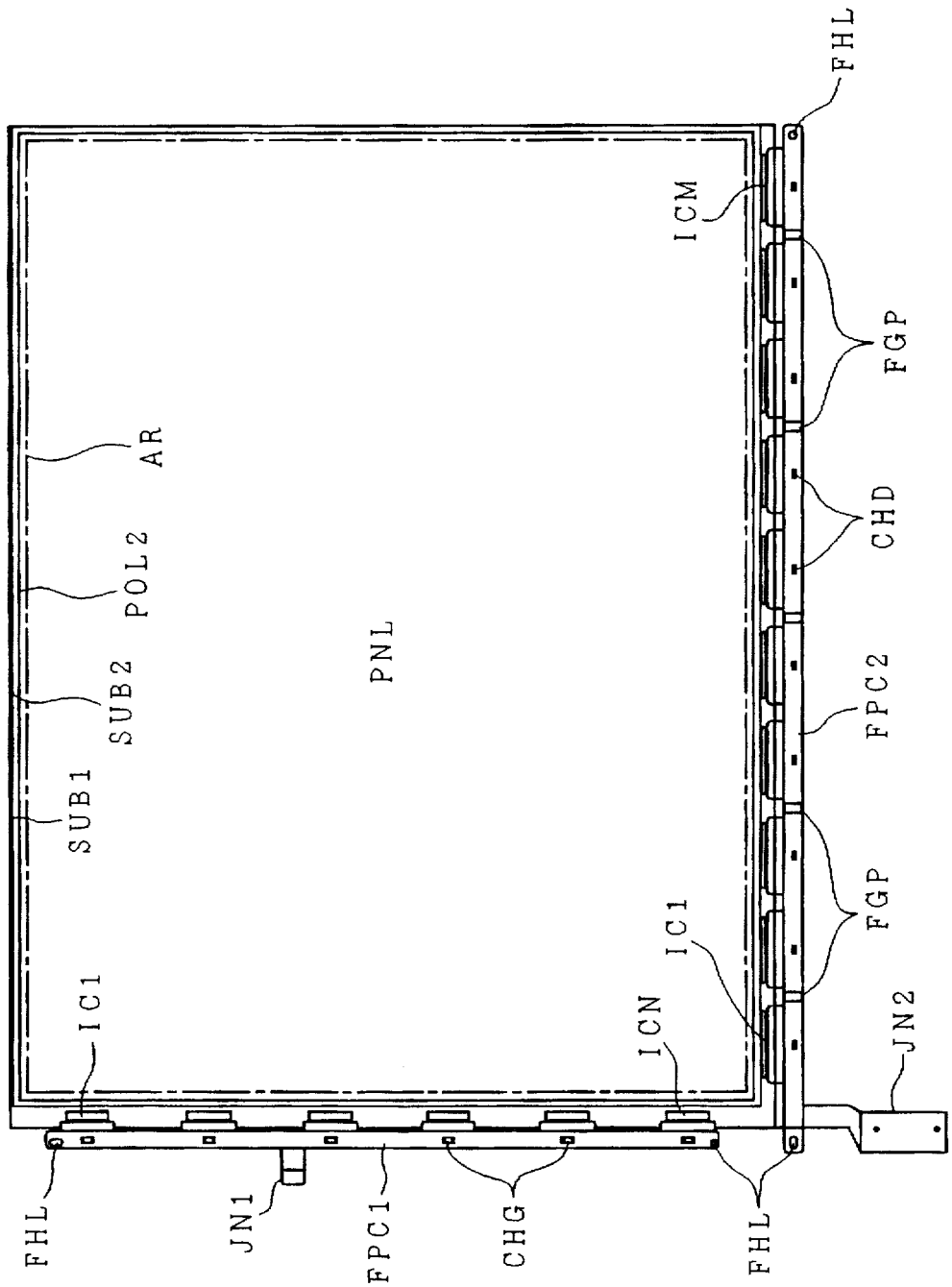
FIG. 4 is a top plan view of a liquid crystal display element having a driver in which a gate-side flexible substrate FPC1 and a drain-side flexible substrate FPC2 before folded are mounted on the outer periphery of a liquid crystal display element PNL.

FIG. 4 is a front view of the liquid crystal display element having a driver substrate in which the gate-side flexible substrate FPC1 and the drain-side flexible substrate FPC2 before being folded are mounted on the outer periphery of the liquid crystal display element PNL.

Figure 5:
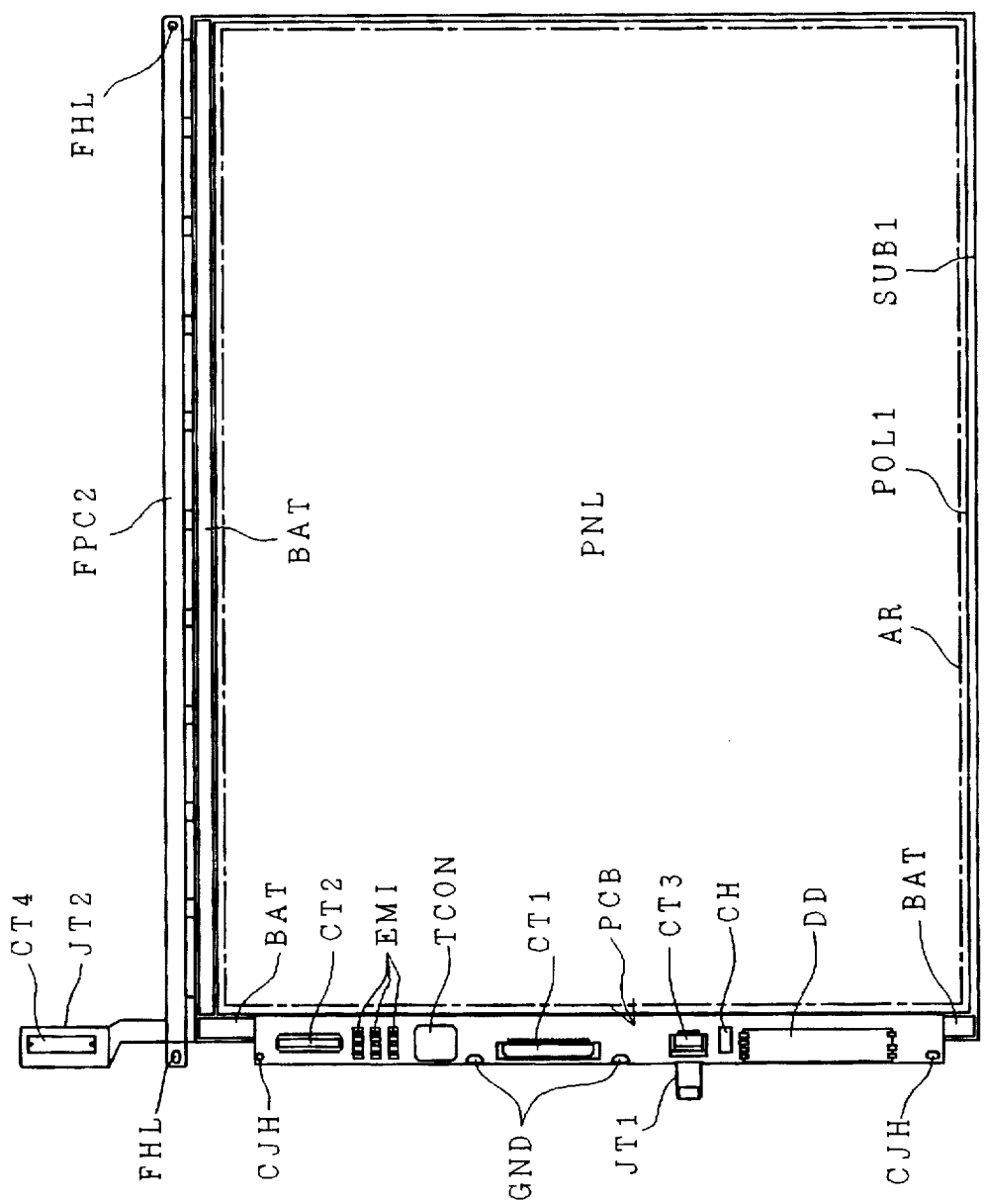
FIG. 5 is a bottom view of a liquid crystal display element provided with the drive substrate of FIG. 4 mounted with an interface circuit board PCB.

FIG. 5 is a back view of the liquid crystal display element having the driver substrate of FIG. 4 with the interface circuit board PCB mounted on it.

Figure 6:
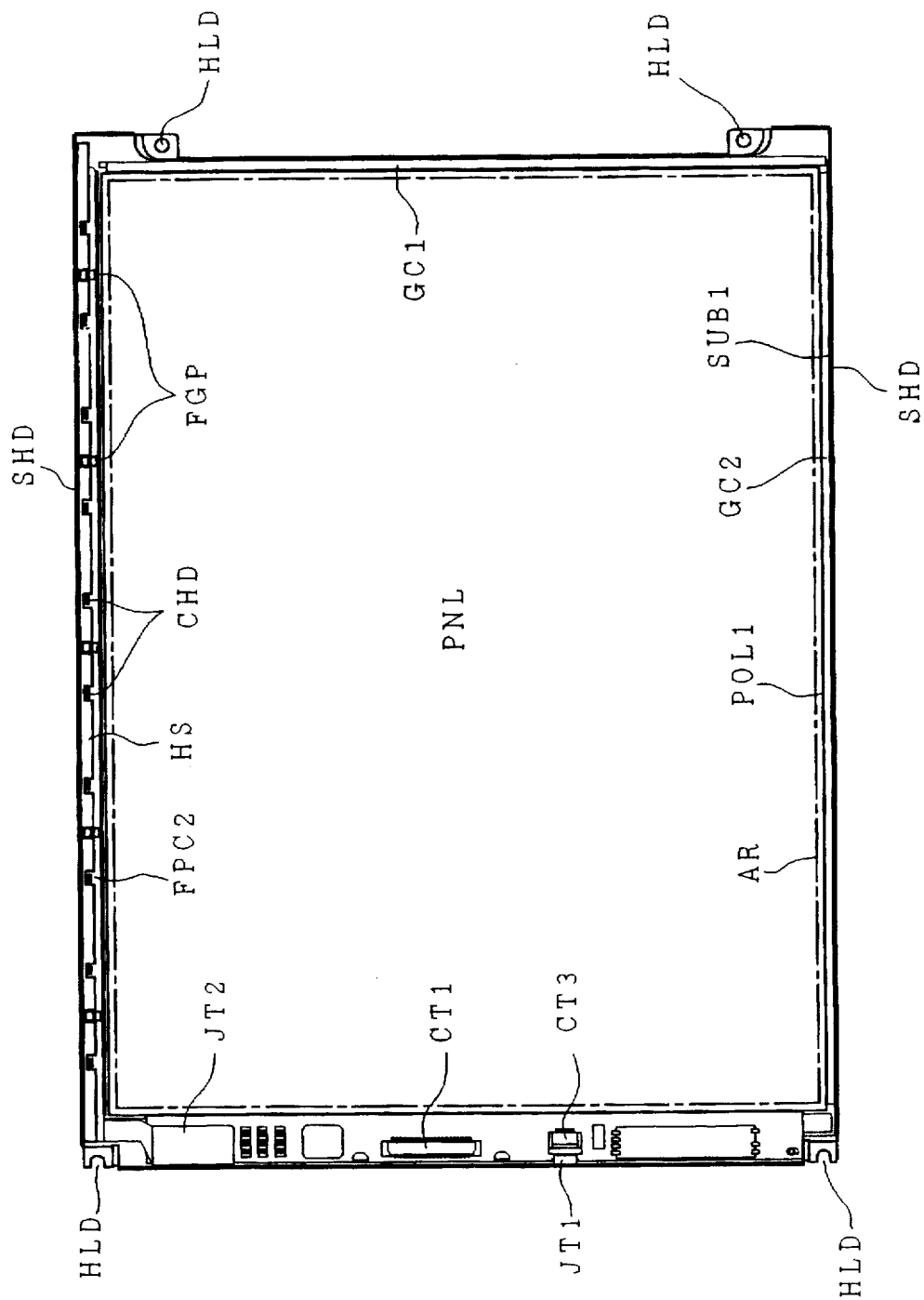
FIG. 6 is a bottom view showing the state that a shielding case SHD is placed down, flexible substrates FPC1 and FPC2 and an interface circuit board PCB are mounted, thereafter the flexible substrate FPC2 is folded and a liquid crystal display element PNL provided with a driver substrate is housed in the shielding case SHD.

FIG. 6 is a back view showing the state wherein the shielding case SHD is put at the bottom, the flexible substrates FPC1 and FPC2 and the interface circuit board PCB are mounted and thereafter, the flexible substrate FPC2 is folded and the liquid crystal display element PNL is housed in the shielding case SHD.

Figure 24:
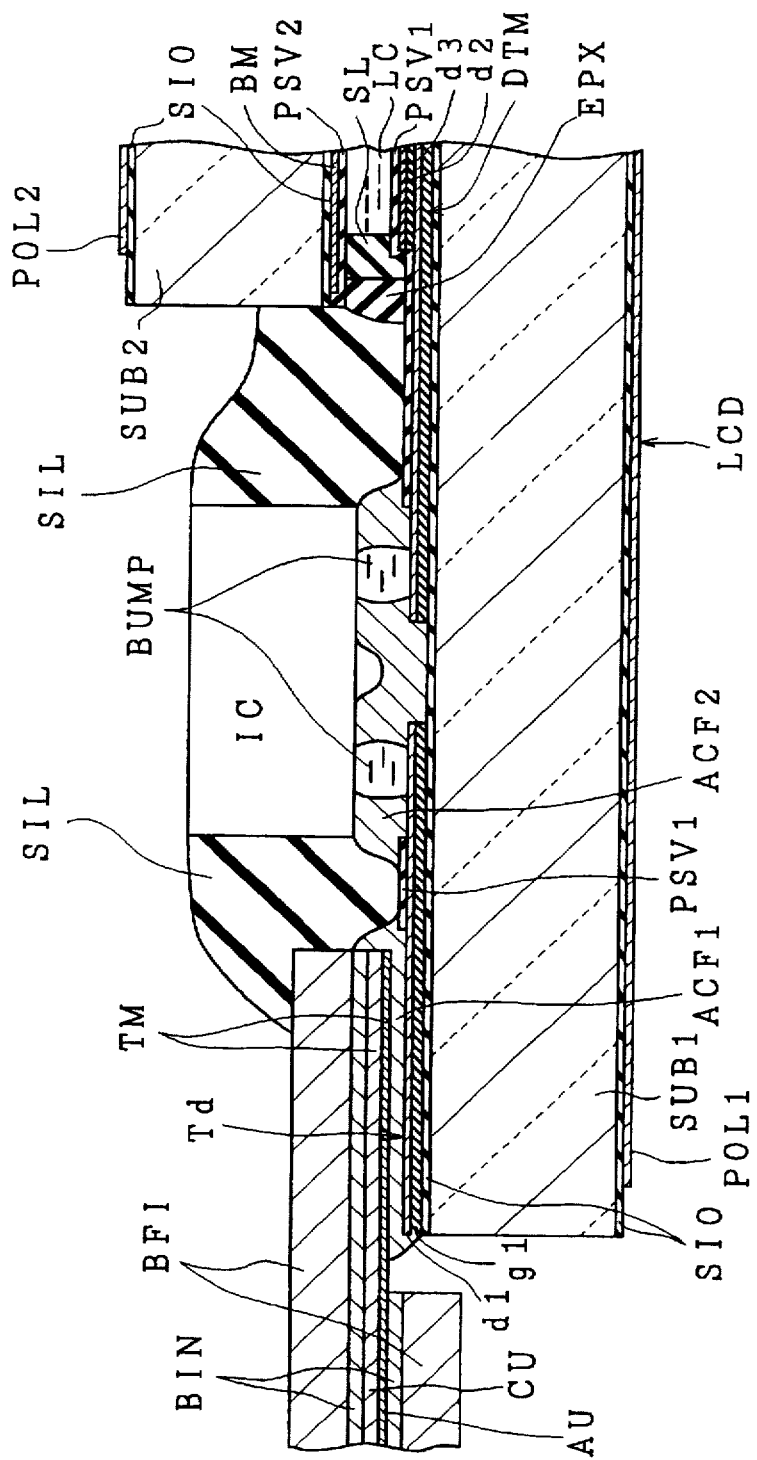
FIG. 24 is a sectional view of the driving IC mounted on the substrate SUB1 of FIG. 19, taken along the line 24—24 of FIG. 19.

The six components at the left side of FIG. 4 are driving IC chips of the vertical scanning circuit side, and the ten components at the bottom are driving IC chips of the drain (video signal) driver side, and these IC chips are COG-mounted on the transparent insulating substrate by means of an anisotropic film (ACF2 in FIG. 24).

Because the COG-mounting directly uses a driving IC, the TAB (tape automated boding) step is unnecessary and thereby the process is shortened, no tape carrier is necessary and therefore, an advantage is obtained that the prime cost is reduced. Moreover, the COG-mounting is suitable as a technique for mounting the very-fine high-density liquid crystal display element PNL. That is, in this embodiment, a TFT liquid crystal display module with a 12.1" screen size of 800×3×600 dots is designed as an XGA panel. Therefore, each dot size of red (R), green (G), and blue (B) is 307.5 μm (gate line pitch)×102.5 μm (drain line pitch) and one pixel has a size of 307.5 μm square in combination of there dots of red (R), green (G), and blue (B).

Therefore, assuming that the number of drain-line leads DTM is 800×3 lines, the lead pitch results in 100 μm or less which is equal to or less than the TCP-mounting connection pitch available at present. In the case of the COG-mounting, however, at present, the minimum value of the pitch between bumps BUMP (see FIG. 24) of a driving IC chip is approx. 70 μm and the minimum value of the cross area with the underlying wiring is approx. 50 μm square. Therefore, in this embodiment, drain driver ICs are lined up along one long side of the liquid crystal display element PNL to lead out drain lines to one long side.

Therefore, the bump BUMP (see FIG. 24) pitch of the driving IC chip can be designed as approx. 70 μm and the cross area with the underlying wiring can be designed to be approx. 50 μm square. Thus, connection with the underlying wiring at higher reliability is realized. Because the gate line pitch is as large as 307.5 μm, the gate-line lead GTM is led on one short side. When the sizes are made further smaller, however, it is possible to lead out gate-line leads GTM to two facing short sides alternately.

According to the method of alternately leading out the drain lines and the gate lines, it is easy to connect the leads DTM and GTM with the output-side bumps BUMP of the driving ICs. However, it is necessary to arrange peripheral circuit boards at the outer peripheries of facing two sides of the liquid crystal display element PNL and thereby, a problem arises that the outside dimensions increase compared to the case of one-side lead-out. Particularly when the number of display colors increases, the number of data lines for display data increases and the outside dimensions of the information processing apparatus increases. Therefore, this embodiment uses a multilayer flexible substrate to reduce the size of the picture-frame portion by leading out the drain lines only to one side.

Figure 17A:
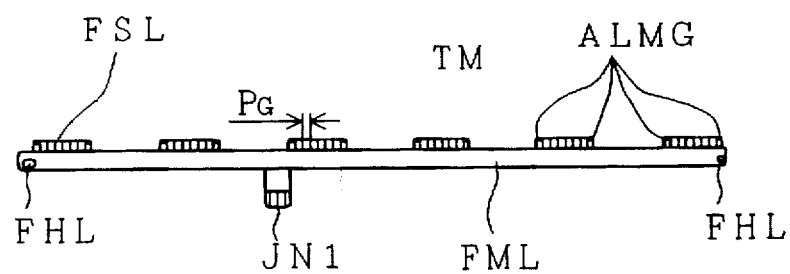
FIG. 17A is a back (bottom) view of a multilayer flexible substrate FPC1 for driving a gate driver and FIG. 17B is a front (top) view of the substrate FPC1.
Figure 17B:
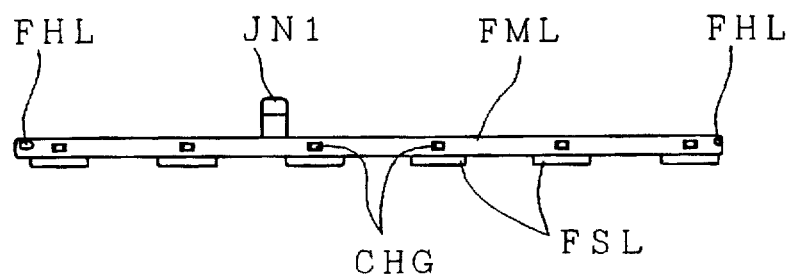

FIG. 17A is a back (bottom) view of the multilayer flexible substrate FPC1 for driving the gate drivers and FIG. 17B is a front (top) view of the FPC1. FIG. 15A is a back (bottom) view of the multilayer flexible substrate FPC2 for driving the drain drivers and FIG. 15B is a front (top) view of the FPC2. FIG. 21A is a sectional view of the FPC2 of FIG. 15A, taken along the line A-A' of FIG. 15A, FIG. 21B is a sectional view of the FPC2 of FIG. 15A, taken along the line B-B' of FIG. 15A, and FIG. 21C is a sectional view of the FPC2 of FIG. 15A, taken along the line C-C' of FIG. 15A. Dimensions in the thickness direction and the plane direction of FIGS. 21A to 21C are different from actual ones because they are exaggeratedly shown.

Figure 18:
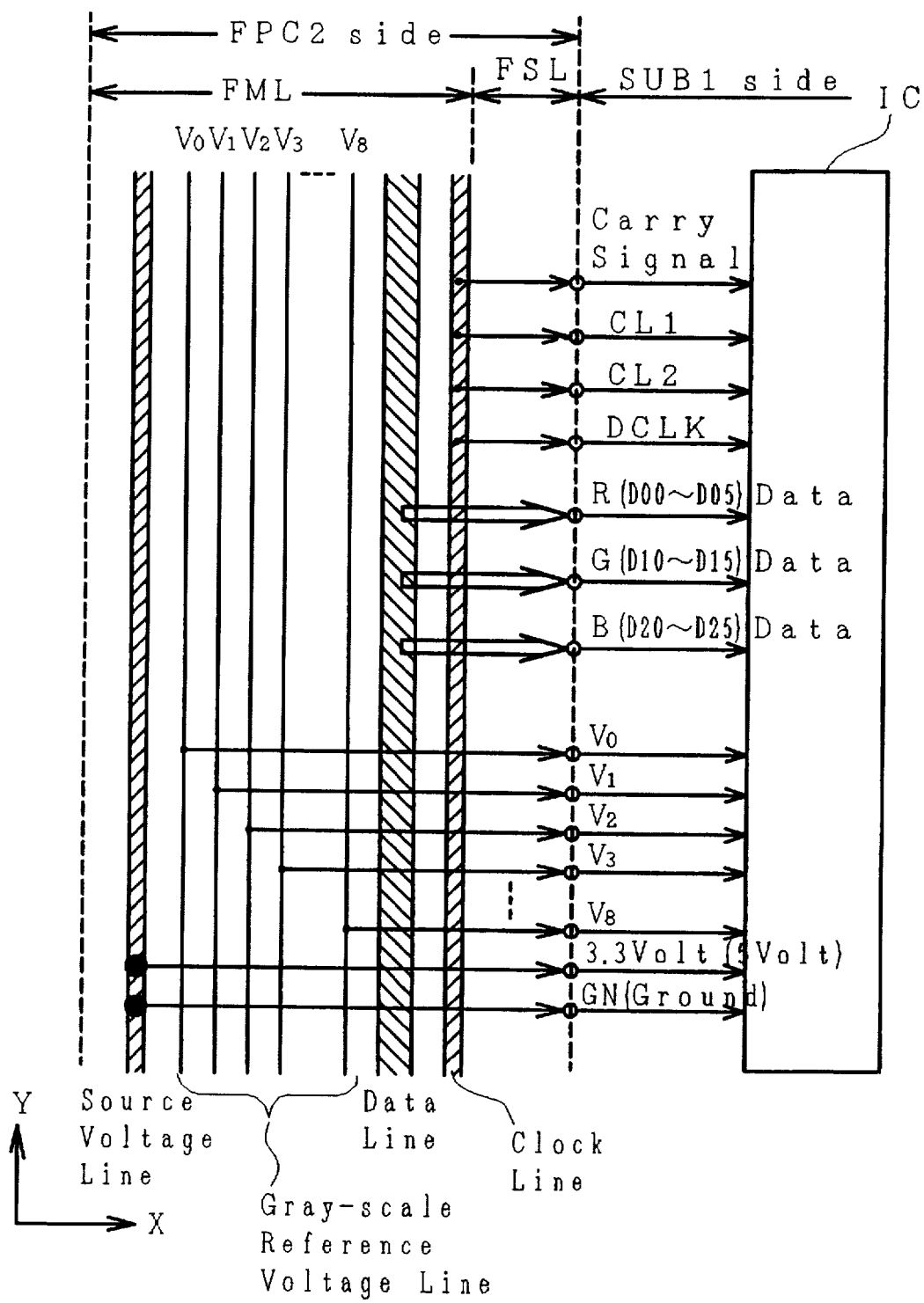
FIG. 18 is a schematic wiring diagram showing the connection relation between the signal wiring in a multilayer flexible substrate FPC and the signal input to a driving IC on a transparent insulating substrate SUB1.

FIG. 18 is a schematic wiring diagram showing the connection relation between the signal wiring in the multilayer flexible substrate FPC2 and the signal inputs to the driving ICs are on the transparent insulating substrate SUB1. The signal wiring in the multilayer flexible substrate FPC2 includes a first wiring group parallel with one side of the transparent insulating substrate SUB1 and a second wiring group vertical thereto. The first wiring group is a common wiring group for supplying signals common to the driving ICs and the second wiring group is a wiring group for supplying signals necessary for each driving IC. Therefore, a portion FSL comprises at least one conductor layer. Moreover, a portion FML comprises at least two conductor layers and, therefore, it is necessary to electrically connect the first wiring group with the second wiring group by way of a through-hole. In this embodiment, it is necessary to decrease the short side length of the portion FML to an extent that the portion FML does not contact an end of a bottom polarizing plate when the portion FML is folded.

That is, as shown in FIG. 21, it is possible to cope with the increase of the number of data lines by providing three or more conductor layers, specifically providing portions FML of eight conductor layers L1 to L8 parallel to the liquid crystal display element PNL and mounting the wiring of peripheral circuits and electronic components on this portion in this embodiment.

The conductor layer L1 is used for a component pad and grounding, L2 is used for a gray-scale reference voltage Vref and a 5-V (3.3-V) power supply, L3 is used for grounding, L4 is used for a data signal and clock signals CL2 and CL1, L5 is used for lead-out wiring which is the second wiring group, L6 is used for a gray-scale reference voltage Vref, L7 is used for a data signal, and L8 is used for a 5-V (3.3-V) power supply.

Figure 23A:
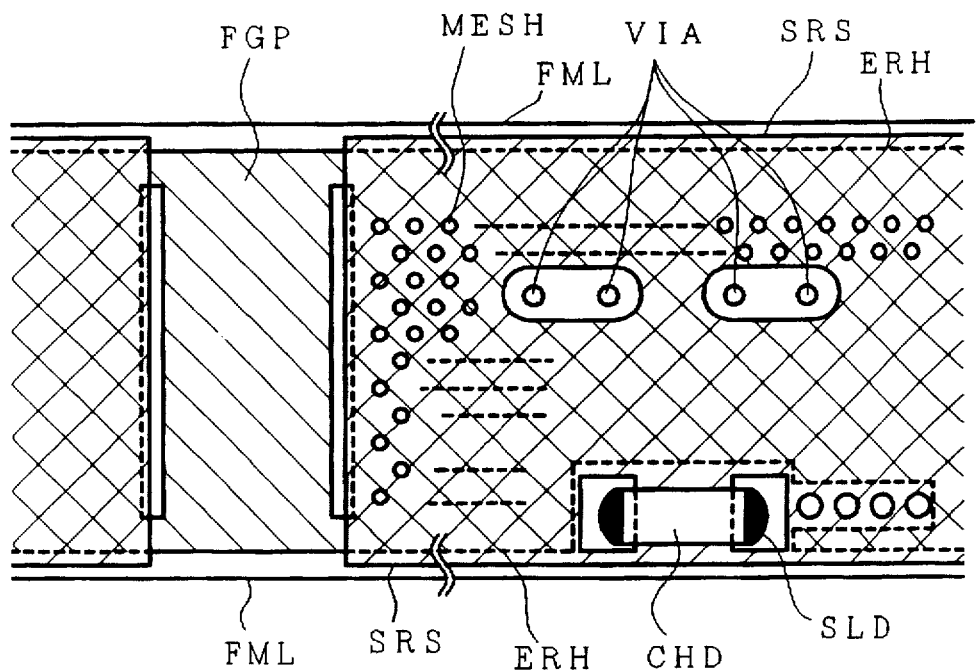
FIG. 23A is a front view (top) showing a pattern of a surface conductor layer at a portion FML of three or more conductor layers of the multilayer flexible substrate FPC2 and FIG. 23B is a locally enlarged detailed front view of the interface circuit board PCB of FIG. 25C, both of which are illustrations showing states that they are almost entirely covered with meshed patterns ERH fixed to a DC voltage.

These conductive layers are electrically connected to each other through through-holes VIA (see FIG. 23A). The conductive layers L1 to L8 are composed of copper CU wiring. A nickel base layer Ni is formed on the copper CU at the portion of the conductive layer L5 connected to input terminal wiring Td (see FIGS. 19 and 20) connected to the driving IC of the liquid crystal display element PNL and, moreover, gold plating AU is applied onto the nickel substrate Ni. Therefore, it is possible to decrease the connection resistance between the output terminal TM and the input terminal wiring Td.

Intermediate layers of polyimide film BFI are provided between the conductive layers L1 to L8 as insulating layers to fix each conductive layer by means of adhesive layers BIN. Every conductive layer is covered with an insulating layer, except for the output terminal TM. At the multilayer wiring portion FML, solder resist SRS is applied to the uppermost and lower most layers in order to ensure insulation. Moreover, an insulating silk material is attached to the outermost surface side.

A multilayer flexible substrate has advantages that the conductive layer L5 including the connection terminal portion TM necessary for COG-mounting can be formed integrally with other conductive layers and the number of components can be decreased.

Moreover, because three or more conductive layers L5 are constituted of the portion FML, the potion FML becomes rigid and not easily deformed and therefore, positioning holes FHL can be formed at this portion. Furthermore, the multilayer flexible substrate is folded with high reliability and accuracy without deforming at this portion. Furthermore, as mentioned later, it is possible to arrange a solid conductive pattern or a meshed conductor pattern ERH (see FIG. 23) in which a plurality of small holes MESH with a diameter of 200 µm are formed on the surface layer L1 and mount components or arrange a peripheral-wiring conductor pattern on the remaining two or more conductor layers.

Furthermore, it is unnecessary for the protruded portion FSL to be a conductive layer of the single layer L5. It is also possible to form the protruded portion FSL out of two conductive layers. The structure of two conductive layers is effective when the pitch of the input terminal wiring Td to the driving ICs is decreased, when the wiring group of one column is connected to a second conductive layer of another layer through the through-holes VIA in cases where patterns of the terminal wiring Td and the connection terminal portion TM are formed on a zigzag fashion on wiring groups of a plurality of columns, the wiring groups are connected to each other by means of an anisotropic conductive film or the like, and the connection terminal portion TM present on the first conductive layer is lead out, and when a part of the peripheral wiring is arranged on the second conductive layer in the protruded portion FSL.

As described above, by forming the protruded portion FSL out of one or two conductive layers, the thermal conductivity can be improved at the time of thermocompression bonding using a heat tool, pressure can uniformly be applied, and the electrical reliability of the connection terminal portion TM and that of the terminal wiring Td can be improved.

Moreover, the multilayer flexible substrate can accurately be folded without applying a bending stress to the connection terminal portion TM. Furthermore, because the protruded portion FSL is transparent, a conductive layer pattern can be viewed from above the multilayer flexible substrate. Therefore, an advantage is also obtained that pattern inspection of the connection state can be performed from above.

In FIG. 15A, symbol JT2 denotes a projection for electrically connecting the drain-side flexible substrate FPC2 to the interface circuit board PCB and CT4 denotes a flat-type connector for electrically connecting the flexible substrate FPC2 provided for the front end of the projection JT2 to the interface circuit board PCB.

Figure 16A:
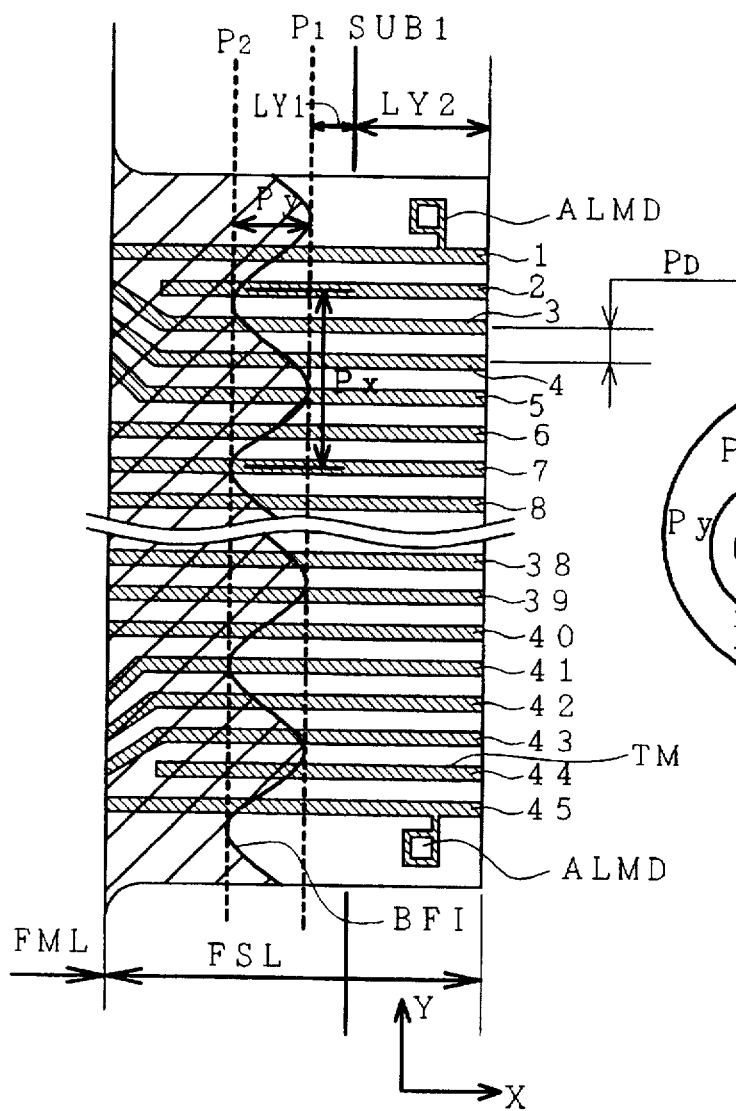
FIG. 16A is an enlarged detailed view of the portion J of FIG. 15A
Figure 16B:
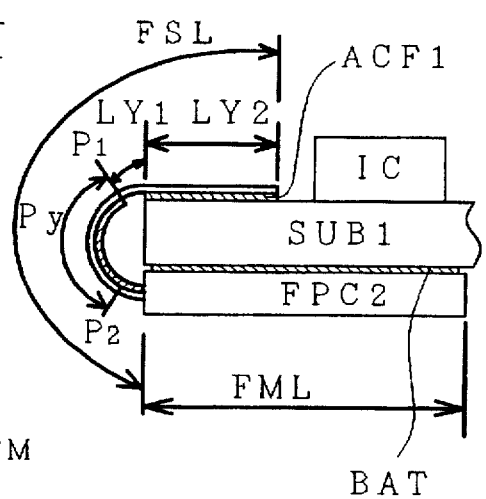
FIG. 16B is a side view showing the state that a multilayer flexible substrate FPC2 is mounted and folded.

FIG. 16A is an enlarged detailed view of the portion J of FIG. 15A and FIG. 16B is a side view showing how the multilayer flexible substrate FPC2 is mounted and folded.

In FIG. 16A, symbol Px denotes the wavelength of the polyimide film BFI whose end is waved, Py denotes the wave height (wave amplitude x2), $P_1$ denotes a straight line connecting wave crests to each other (referred to as a wave crest line), $P_2$ denotes a straight line connecting wave troughs to each other (referred to as a wave trough line), LY2 denotes the length of the joint with the bottom transparent substrate SUB1 of the multilayer flexible substrate FPC2 (referred to as the connection length), and LY1 denotes the length between the joint with the bottom transparent substrate SUB1 of the multilayer flexible substrate FPC2 and the wave crest line $P_1$.

As shown in. FIG. 16B, one end of the drain-side flexible substrate FPC2 is connected to the terminal (Td of FIGS. 19 and 20) of the drain line at an end of the bottom transparent glass substrate SUB1 of the liquid crystal display element PNL through an anisotropic conductive film ACF1, the FPC2 is folded at the intermediate portion of the wave height $P_Y$ outside the end side of the ACF1, and the multilayer wiring portion FML at the other end of the FPC2 is arranged under an end of the bottom transparent glass substrate SUB1 and attached to the underside of the bottom transparent glass substrate SUB1 by a double-sided adhesive tape BAT. The output terminals TM (1–45) of FIG. 16A correspond to the terminals Td (1–45) of FIGS. 19 and 20 and the terminals TM are electrically connected to the terminals Td through the anisotropic conductive film ACF1 respectively.

Symbol $P_D$ of FIG. 16A denotes the pitch between the output terminals TM, which is 0.41 mm. In this embodiment, the ends of the polyimide film (cover film) made of polyimide resin serving as an insulating film of the flexible substrate FPC2 are formed into a waved shape (or serrated shape) in the folding line direction.

For example, the wavelength $P_X$ is 0.6 mm, the wave height $P_Y$ is 0.6 to 1 mm, a wave swell radius (R) is 0.3 mm, the connection length LY2 is 1.75 mm and LY1 is 0.3 to 0.5 mm. The length between the end of the flexible substrate FPC2 connected to the bottom transparent glass substrate SUB1 and the crest line $P_1$ is in a range of the sum of the connection length LY2=1.75 mm with the bottom transparent glass substrate SUB1 of the flexible substrate FPC2 and the cutting error of 0.3 to 0.5 mm of the transparent glass substrate SUB1.

Moreover, the length of the folded portion of the flexible substrate FPC2 is determined from the formula: the thickness of the transparent glass substrate SUB1 (0.7 to 1.1 mm)×circle ratio π+2=1.7 to 1.1 mm. The wave crest line $P_1$ and through line $P_2$ are present in the range of the folded portion length. Moreover, in this embodiment, the length of the flexible substrate FPC2 is 263.42±0.5 mm, the width including the multilayer wiring portion FML and the protruded portion FSL is 8.7 mm, the width of the multilayer wiring portion FML is 5 mm, the width of the protruded portion FSL is 3.7 mm, the center line interval between frame ground pads FGP and FGP (see FIG. 15B) is 47.76 mm, the length of a long side of the rectangular portion provided with the connector CT4 at the front end of the projection JT2 is 22 mm, the center line interval between the output terminals TM denoted by numbers 1 and 45 in FIG. 16A is 18.04 mm, the center line interval between outermost terminals of the connector CT4 is 14.5 mm, and the total thickness of the layers of the portion FML is approx. 350 to 400 μm.

Furthermore, in this embodiment, because the ends of the polyimide film BFI of the protruded portion FSL of the signal-inputting flexible substrate FPC2, whose one end is connected to an end of the transparent glass substrate SUB1 of the liquid crystal display element and whose the other end is folded to the bottom (or top) of the substrate SUB1, are formed into a waved shape (or shape such as a serrated shape having crests and troughs) in the folding line direction, it is possible to prevent stresses from concentrating on the ends of the polyimide film BFI at the folded portion, to provide a preferable curvature for the folded portion, to prevent disconnection from occurring, and to improve the reliability.

Furthermore, in this embodiment, the conductive layer of the gate-side flexible substrate FPC1 is of a three-layer structure in which L1 is used for $V_{dg}$ (10 V), $V_{sg}$ (5 V), and $V_{ss}$ (ground); L2 is used for lead-out wiring, clock CL3, FLM, and $V_{dg}$ (10 V); and L3 is used for $V_{EG}$ (−10 to −7V), VEE (−14 V), $V_{SG}$ (5 V), and common voltage $V_{com}$.

Furthermore, the flexible substrate FPC1 has a length of 172.3 mm.

The width including the multilayer wiring portion FML and the protruded portion FSL is 7.25 mm, the width of the multilayer wiring portion FML is 4.5 mm, the width of the protruded portion FSL is 2.75 mm, the width of the electrical connection means JN1 is 5.5 mm and the length of the JN1 is 9.6 mm, center line interval between the outermost output terminals TM of the protruded portion FSL is 11.5 mm, and the total thickness of the layers is 273 μm.

Figure 19:
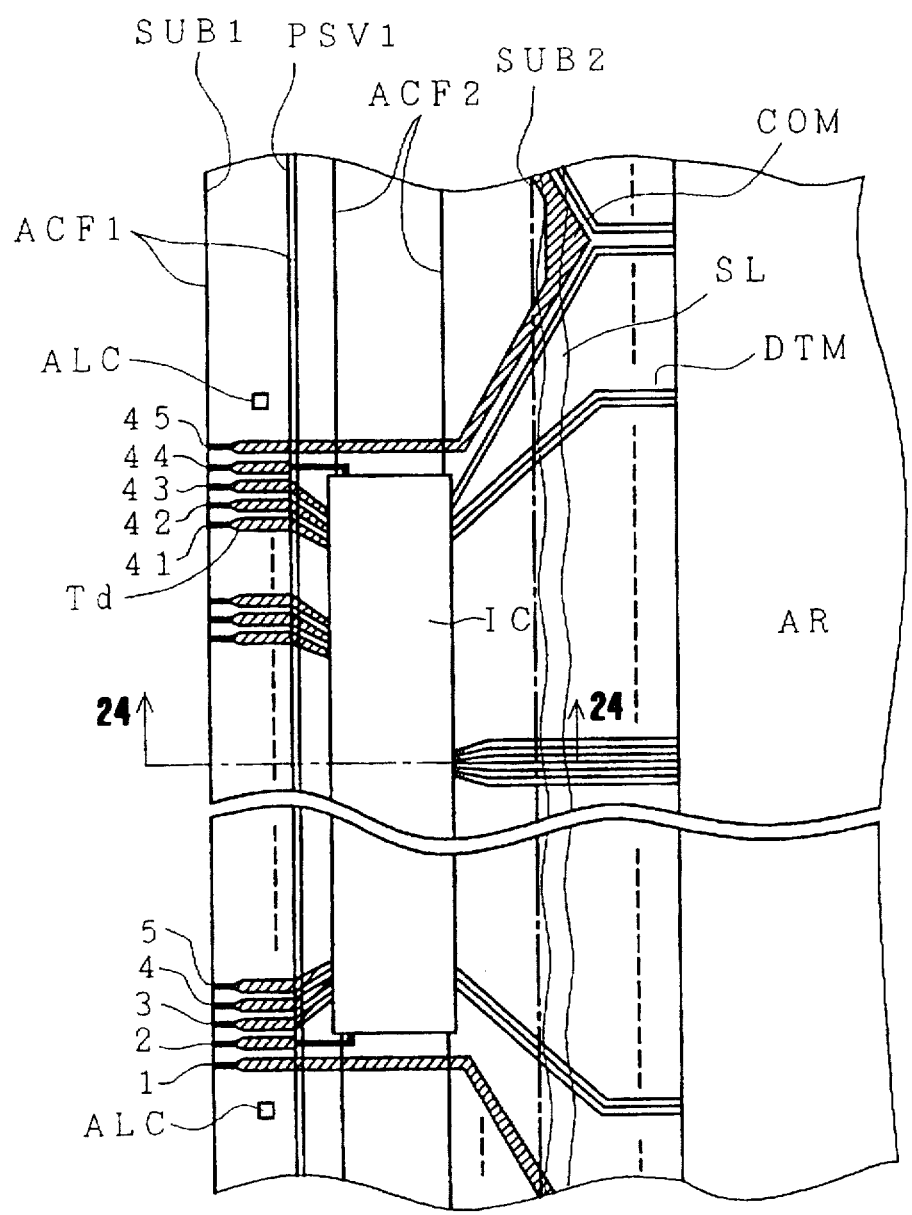
FIG. 19 is a top view showing the state that a driving IC is mounted on the transparent insulating substrate SUB1 of the liquid crystal display element.
Figure 20:
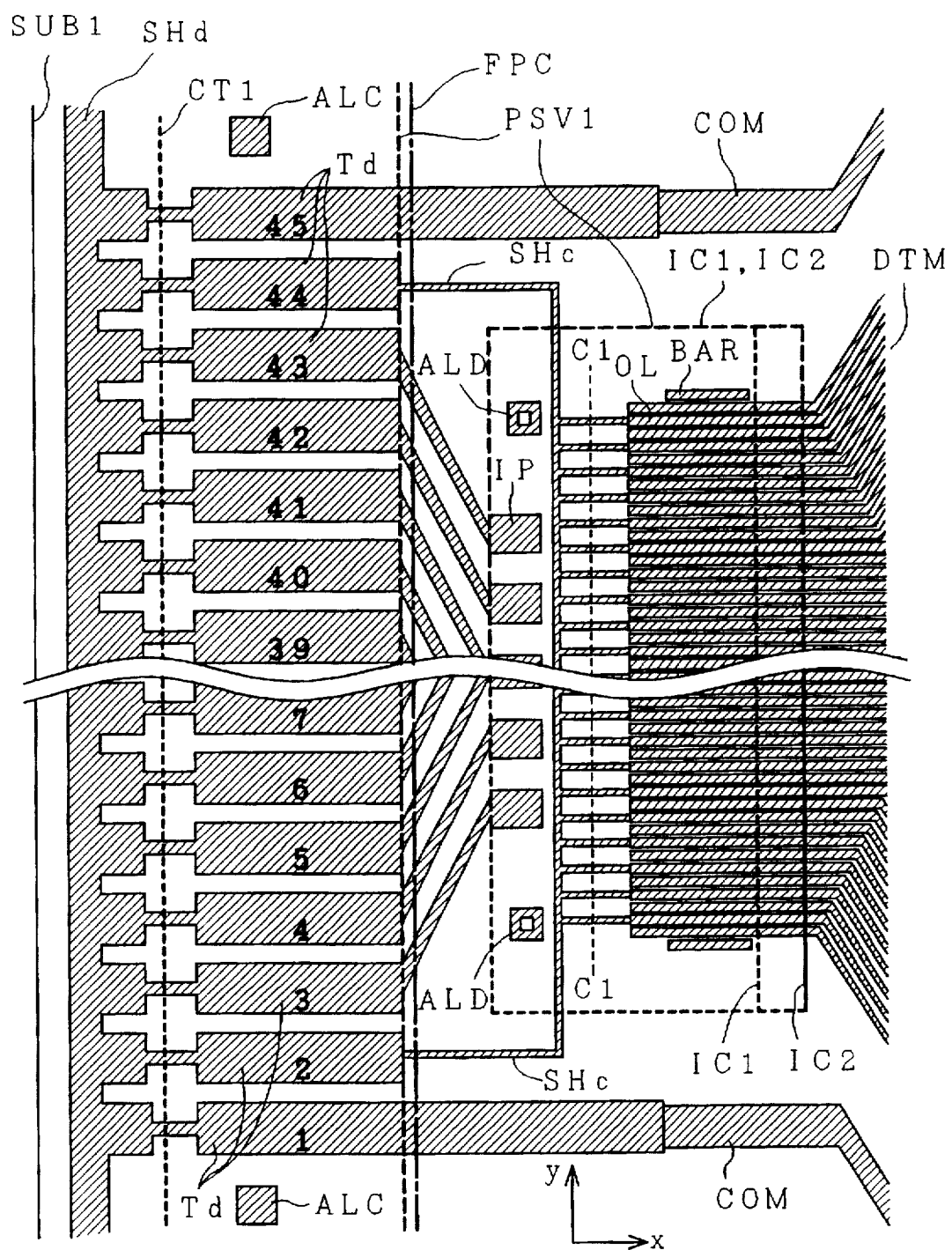
FIG. 20 is a top view of essential portions around the drain driving IC of the transparent insulating substrate SUB1 and nearby a cutting line CT1 on the substrate.

The drain driver driving IC has a total of 45 input lines, as shown in FIGS. 19 and 20, and they are electrically connected to the output terminals TM Nos. 1 to 45 shown in FIG. 16A. The pitch PD between the terminals TM is approx. 410 μm.

In this embodiment, dummy lines NC (terminal numbers 2 and 44) for improving the connection reliability are arranged to be adjacent to the 41 input terminals TM.

Moreover, terminals (numbers 1 and 45) shown in FIG. 16A are arranged outside the dummy terminals in order to supply the voltage $V_{com}$, to a common transparent pixel electrode COM which is an opposing electrode of a liquid crystal capacitor C1c and is located inside the transparent insulating substrate SUB2. Thus, the common voltage is supplied to the common transparent pixel electrode COM on the transparent insulating substrate SUB2 side from conductive beads or paste through the wiring Td pattern on the transparent insulating substrate SUB1.

The alignment marks ALMD are provided by pattern-connecting them to the terminals (numbers 1 and 45) electrically connected to the common electrode COM and aligned with rectangular patterns ALC (see FIG. 20) on the transparent substrate SUB1 respectively.

<<Conductive layer portions FSL and FML>>

The shape of the conductive layer portion FSL of one or two conductor layers will be described below.

The protrusion length of the portion FSL comprising conductor wiring of one or two layers is approx. 3.7 mm because a folded portion (see FIG. 16A) is provided in this embodiment. However, the portion FSL can further be shortened in a structure not provided with a folded portion.

The protrusion shape of the portion FSL is formed into a convex shape divided for each driving IC. Therefore, it is possible to prevent the phenomenon that the flexible substrate is thermally expanded in the major-axis direction at the time of thermo-compression bonding, causing pitches $P_G$ and $P_D$ of the terminals TM to be changed, and separation from or defective connection to the connection terminals Td to occur. That is, by employing a convex shape for each driving IC, it is possible for the deviation of the pitches PG and PD of the terminal TM to be limited to the thermal expansion value corresponding to the cycle length for each driving IC. In this embodiment, by forming the convex shape divided into 10 divisions in the major-axis direction of the flexible substrate, it is possible to decrease the thermal expansion value to approx. ¹⁄₁₀, to contribute to relaxation of the stress of the terminals TM, and to improve the reliability of the liquid crystal module MDL against heat.

The conductor layer portion FML of three conductor layers or more will be described below.

Chip capacitors CHG and CHD are mounted on the conductor layer portion FML of the FPC1 and FPC2, respectively. That is, in the case of the gate-side substrate FPC1, six chip capacitors CHG are soldered between the ground potential Vss (0 V) and the power supply Vdg (10 V) or between the power supply Vsg (5 V) and the power supply Vdg.

Moreover, in the case of the drain-side substrate FPC2, a total of ten chip capacitors CHD are soldered between the ground potential Vss and the power supply Vdd (5 or 3.3 V) or between the ground potential Vss and the power supply Vdd.

These capacitors CHG and CHD are used to decrease noise superposed on the power supply line.

This embodiment is so designed that these chip capacitors CHD are soldered only on either-side surface conductor layer L1 and all are located under the transparent insulating substrate SUB1 after being folded.

Therefore, it is possible to mount a capacitor for smoothing power-supply noise on the substrates FPC1 and FPG2 without changing the thickness of the liquid crystal module MDL.

<<Meshed pattern ERH>>

A method for reducing high-frequency noise generated by an information processing apparatus will be described below.

The metallic shielding case SHD side is the surface side of the liquid crystal display module MDL and also the front side of the information processing apparatus. Therefore, EMI (electromagnetic interference) noise generated from the surface may cause a serious problem in the operating environment of external units.

Therefore, in this embodiment, the surface layer L1 of the conductor layer portion FML is covered with a solid or meshed pattern ERH at a ground voltage or a DC voltage as much as possible.

FIG. 23A is a top view showing the surface conductor layer pattern structure of the multilayer wiring portion FML located at a part of FIG. 15B. The meshed pattern ERH comprising a plurality of holes with a diameter of approx. 300 μm formed on the surface conductor layer L1 covers almost the entire area of the surface layer L1 except for the through-holes VIA and the portion of the capacitor component CHD.

Moreover, the pattern ERH is provided to reduce EMI noise by arranging the patterns FGP exposed from the solder resist SRS at five places on the drain-side substrate FPC2 as shown in FIG. 15B and soldering them to the ground FGF (see FIG. 2) of the shielding case SHD through the frame ground HS (FIGS. 1 and 14) made of a metallic thin plate, which will be mentioned later. That is, when a circuit board is divided into a plurality of portions as an this embodiment, no electrical problem occurs if at least one place on a driver substrate is connected to the frame ground. In a high-frequency region, however, the number of places connected to the frame ground is small, and the generation potential of unwanted radiation radio waves causing EMI is raised due to reflection of electric signals or fluctuation of the potential of ground wiring because of the difference of characteristic impedance between driver substrates. Particularly, in the active-matrix-type module MDL using a thin film transistor, it is difficult to take measures for EMI because high-speed clocks are used. To prevent EMI, the ground wiring (AC ground potential) is connected to a common frame with a sufficiently low impedance (that is, the shielding case SHD) at a plurality of places, five places in this embodiment, of the drain driver substrate FPC2. Because the ground wiring in the high-frequency region is enhanced by using the frame ground HS as an intermediary, the field intensity of radiation is greatly improved in the case where the ground wiring is connected at five places in this embodiment compared to the case where the ground wiring is connected to the shielding case SHD at only one place as a whole.

<<Frame ground HS>>

FIG. 14A is a front view of the metallic thin plate HS (hereafter referred to as a frame ground) for providing a frame ground, FIG. 14B is a back view of the frame ground HS, FIG. 14C is a lateral view of the frame ground HS, and FIG. 14D shows enlarged detailed views of the portions A, B, C, and D in FIGS. 14A and 14B.

Figure 28:
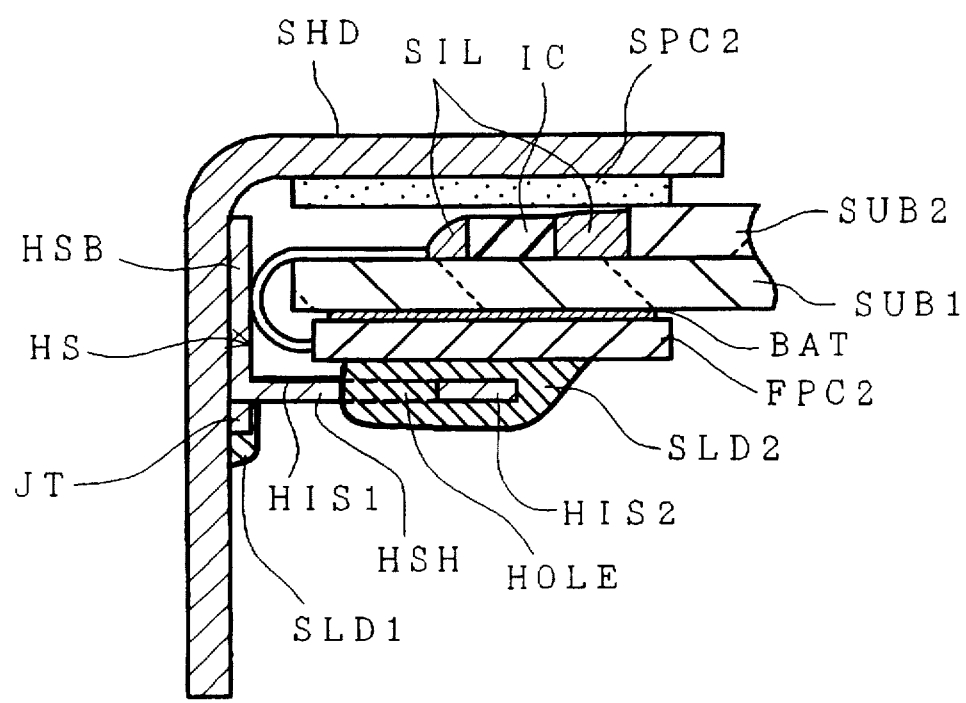
FIG. 28 is an enlarged detailed view of the essential portion of FIG. 26A showing a solder connected state of a frame ground HS.

The positional relation of the frame ground HS to other members is shown in FIG. 1, and the positional relation after the frame ground HS is set is shown in FIGS. 26 and 28.

To prevent EMI, the frame ground HS comprises a first metallic thin plate HSB and a second metallic thin plate HSH arranged perpendicular to each other, which are fabricated by bending a slender metallic thin plate having a thickness of 0.2 mm, which is thinner than the shielding case SHD, in its extending direction by 90°.

The projection JT projects from the metallic thin plate HSB downward in the same plane as the metallic thin plate HSB. As shown in FIG. 14A, five projections JT are formed in the extending direction of the metallic thin plate HSB at certain intervals, which are electrically and mechanically connected to the ground FGF (FIG. 2) of the metallic shielding case SHD.

Five portions HIS2 of the second metallic thin plate HSH are electrically and mechanically connected to five frame ground pads FGP (see FIG. 15B) formed at certain intervals in the extending direction of the drain-line driving flexible substrate FPC2 on the surface of the FPC2 respectively by soldering. A hole HOLE is formed adjacently to each solder connected portion HIS2. The hole HOLE makes it possible to decrease the heat capacity for soldering and to preferably solder the soldering portion HIS2 and the frame ground pad FGP. Moreover, it is possible to form a notch instead of the hole HOLE.

HIS1 is an insulating material joined to the metallic thin plate HSH, which covers the metallic surface, except for the soldering portion HIS2, to prevent a short circuit with other components. Both sides of the soldering portion HIS2 and the projection JT are solderable faces and other faces are rust-proofed. Moreover, a dent DNT in which a chip component (CHD shown in FIGS. 4, 15, 22A, and 26: a power-supply noise removing chip capacitor connected to a power supply line) mounted on the flexible substrate FPC2 is housed is formed in the metallic thin plate HSH.

As shown in FIG. 28, the frame ground HS, having the first metallic thin plate HSB and the second metallic thin plate HSH perpendicular to each other, electrically connects the ground line of the flexible substrate FPC2 to the metallic shielding case SHD, the metallic thin plate HSH is arranged under the flexible substrate FPC2 arranged under an end of the bottom transparent glass substrates SUB1, and the solder connected portion HIS2 of the metallic thin plate HSH is electrically and mechanically connected to the frame ground pad FGP of the flexible substrate FPC2 through the solder SLD2.

Moreover, the metallic thin plate HSB is arranged along the inner side of the shielding case SHD and its projection JT is electrically and mechanically connected to the ground FGF of the shielding case through the solder SLD1.

In this embodiment, the ground line of the drain-line driving flexible substrate FPC2 is electrically connected to the metallic shielding case SHD with a sufficiently low impedance through the frame ground HS made of a metallic thin plate. Therefore, it is possible to supply a stable ground line as described above and to enhance a ground line in a high-frequency region.

Therefore, a stable display quality can be obtained and harmful radiated radio waves causing EMI can be prevented because it is possible to remove the influence of noise incoming from the outside or generated inside. Moreover, the connection workability is improved compared to the technique for bending pawls integrally formed by cutting a part of the top or the side of the shielding case SHD and connecting it with the ground line of the circuit board, and the necessary area in the bending direction can be reduced. Therefore, it is advantageous to decrease the thickness of the picture-frame portion of the liquid crystal display module MDL, to decrease the thickness and size of the MDL and the information processing apparatuses (FIGS. 35 and 36) and to increase the size of the screens.

In this embodiment, the circuit board to be electrically connected to the shielding case SHD through the frame ground HS is the drain-line driving flexible substrate PFC2. The gate-line scan driving flexible substrate FPC1 does not take the frame ground because the clock signal inputted to the gate-side flexible substrate FPC2 is fast and noise is easily generated, but the clock signal inputted to the drain-side flexible substrate FPC1 is slow and noise is are not easily generated. Moreover, because a plurality of frame ground pads PGP are provided at intervals in the extending direction of the flexible substrate FPC2, the potentials of the power supply and the ground become more stable. Therefore, impedance matching becomes good compared to the case where the flexible substrate FPC1 is connected to the shielding case SHD at one point.

Moreover, by taking the frame ground at a place far from the signal input side of the circuit board, the ground can further be stabilized and it is possible to prevent the flexible substrate from acting as an antenna.

<<Interface circuit board PCB>>

Figure 25A:
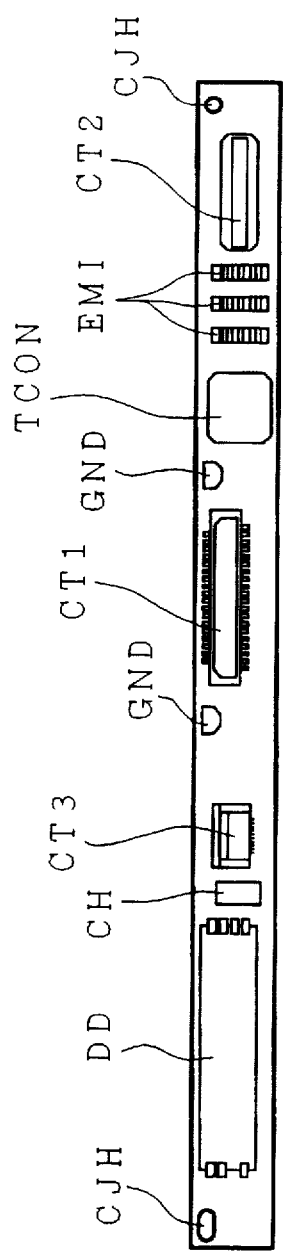
FIG. 25A is a back (bottom) view of the interface circuit board PCB having functions of a controller section and a power supply section.
Figure 25B:
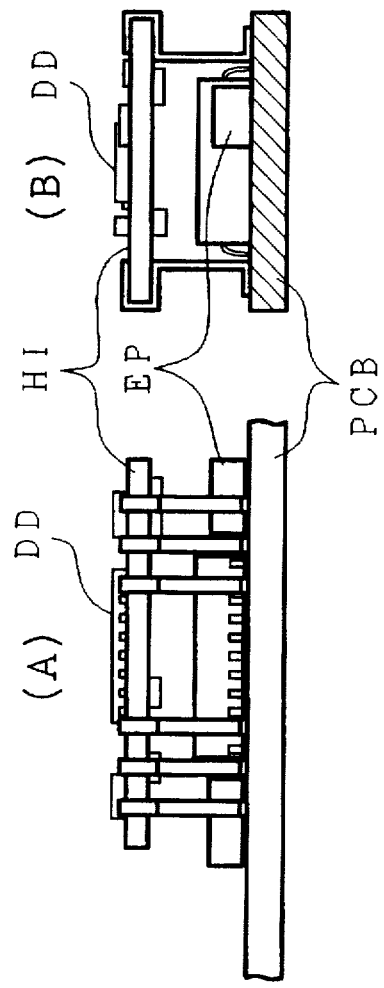
FIG. 25B is a front side view and a lateral side view of a part of a mounted hybrid integrated circuit HI.
Figure 25C:
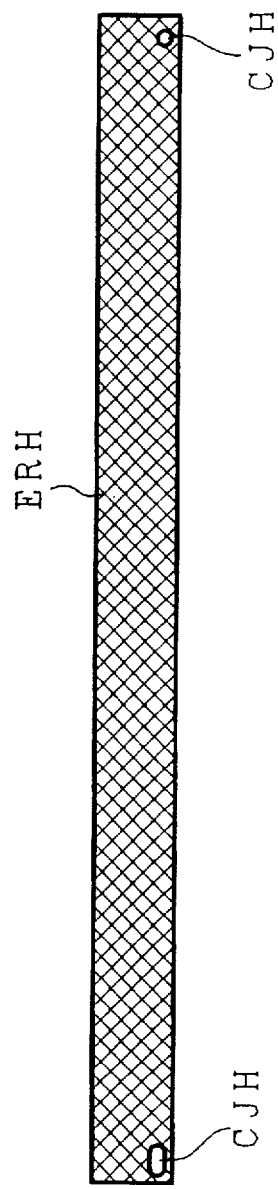
FIG. 25C is a front (top) view of the interface circuit board PCB.

FIG. 25A is a back (bottom) view of an interface circuit board PCB functioning as a controller section and a power supply section, FIG. 25B is a front view and a lateral view of part of a mounted hybrid integrated circuit HI, and FIG. 25C is a front (top) view of the interface circuit board PCB.

In this embodiment, the board PCB is a multilayer printed circuit board of six conductor layers made of glass epoxy. Though a multilayer flexible substrate can also be used, a multilayer printed circuit board is used whose price is relatively low because the board PCB does not have a folded structure.

All electronic components are mounted on the underside of the board PCB, that is, the back of the PCB viewed from the information processing apparatus. An integrated circuit device TCON is arranged on the board as a display controller. The integrated circuit device TCON is not housed in a package, but is constituted by directly mounting an integrated circuit IC on a printed circuit board by use of a ball grid array.

The interface connector CT1 is located at almost the central portion of the board and, moreover, a plurality of resistors, capacitors, and high-frequency-noise removing circuit components EMI are mounted on the board.

Furthermore, the hybrid integrated circuit HI is constituted by hybrid-integrating a part of the circuits and mounting a plurality of integrated circuits and electronic components mainly for a power supply on the top and the underside of a small circuit board, above the interface circuit board PCB as one unit. As illustrated, the leads of the hybrid integrated circuit HI are formed to be long and a plurality of electronic components EP including the TCON are also mounted on the circuit board PCB below the hybrid integrated circuit HI.

Furthermore, this embodiment uses the connector CT3 for the electrical connection between the gate driver substrate FPC1 and the interface circuit board PCB through the electrical connection means JN1.

The connector CT3 is used because it can be electrically connected to the flexible substrate FPC1 even if the number of pixels and the number of display colors increase and consequently the wring pitch decreases.

Figure 23B:
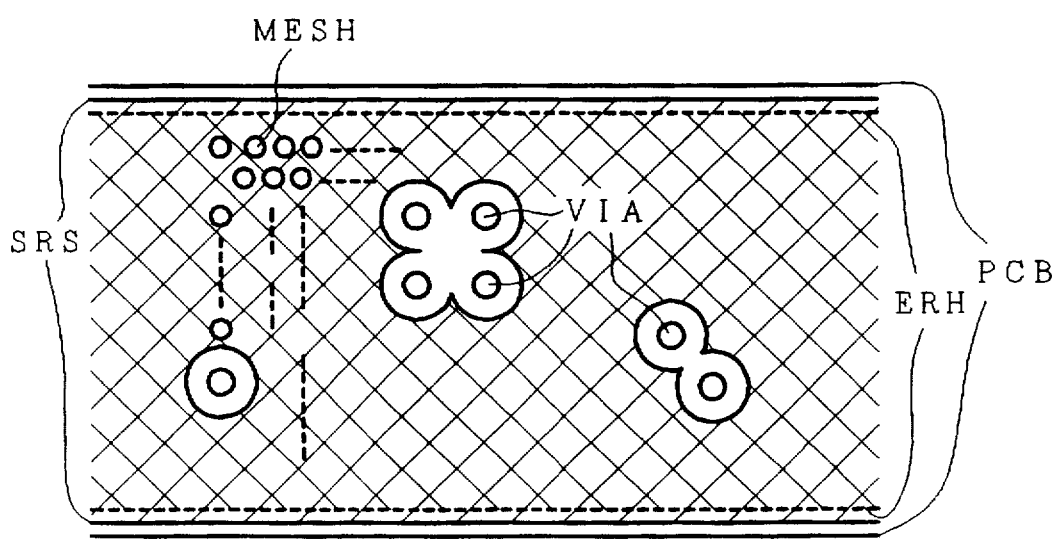

The top of the board PCB is the surface side when viewed from the information processing apparatus, which is the direction where most EMI noise is radiated. Therefore, in this embodiment, almost the entire surface of the multilayer surface conductor layer is covered with the solid or meshed pattern ERH for ground. FIG. 23B is an enlarged top (front) view of the meshed pattern ERH. The meshed pattern ERH made of a copper conductor is almost entirely formed under the solder resist SRS except for the through-holes VIA portion.

The pattern ERH can decrease EMI noise by electrically connecting it to the ground pattern GND on the underside of the board PCB. The ground pattern GND is connected to the body-side ground by connecting the ground GND of the board PCB to the ground FGN of the shielding case SHD and moreover by soldering the grounds GND and FGN to the ground extending from the connector CT1.

In this embodiment, the interface circuit board PCB has a length of 172.3 mm and a width of 13.1 mm.

As described above, the surface conductor layers of the flexible substrates FPC1 and FPC2 are also covered with the pattern ERH and the outer peripheries of two sides of the liquid crystal display element PNL are both fixedly connected to a DC potential. Therefore, it is possible to effectively reduce the EMI noise radiation emitted from the inside of the substrates.

Figure 27A:
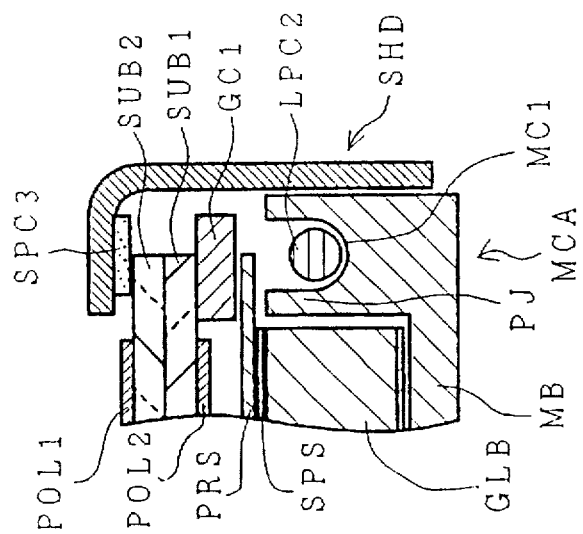
FIG. 27A is a sectional view of the liquid crystal display module in FIG. 2A, taken along the line 27A—27A of FIG. 2A
Figure 27B:
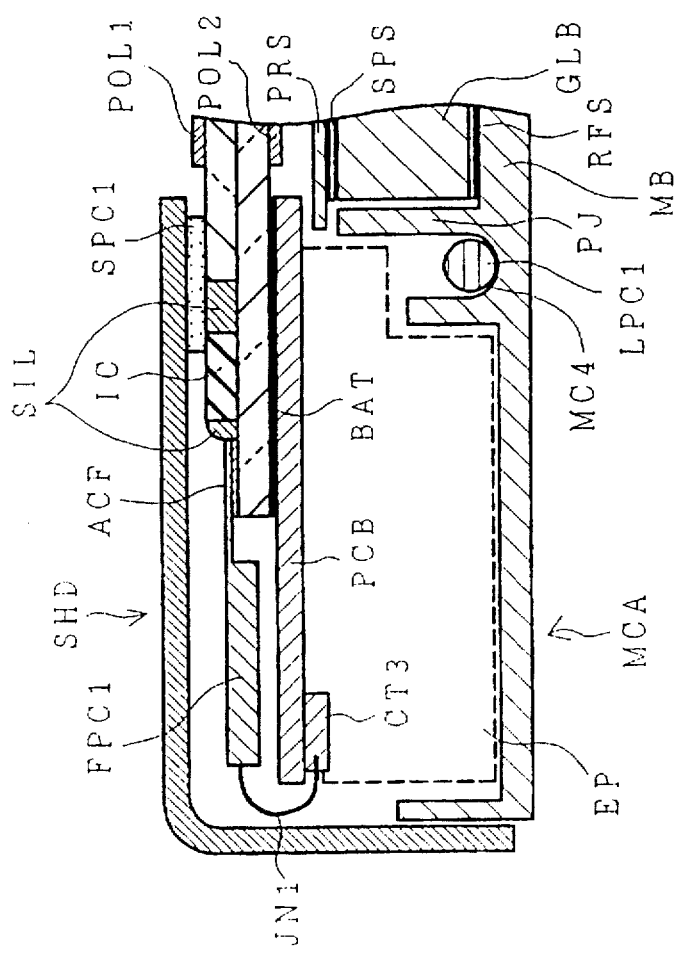
FIG. 27B is a sectional view of the module of FIG. 2A, taken along the line 27B—27B of FIG. 2A.

FIG. 27A is a sectional view of the assembled liquid crystal display module of FIG. 2, taken along the line C-C' of FIG. 2 and FIG. 27B is a sectional view of the module of FIG. 2, taken along the line D-D' of FIG. 2.

As shown in FIG. 27, when viewed from the direction vertical to the transparent glass substrates SUB1 and SUB2, the interface circuit board PCB is superposed on the liquid crystal display element PNL and arranged under the underside of the bottom transparent insulating substrate SUB1. Moreover, one end of the gate driver flexible substrate FPC1 is directly electrically and mechanically connected to the transparent glass substrate SUB1 of the liquid crystal display element PNL and almost the entire width of the substrate FPC1 is superposed on the interface circuit board PCB without being folded, unlike the drain side. Therefore, by overlapping the interface circuit board PCB with a part of the liquid crystal display element PNL and, moreover, by superposing the gate driver substrate FPC1 on the interface circuit board PCB, it is possible to reduce the width and area of the frame portion and to decrease the outside dimensions of the liquid crystal display element and those of the information processing apparatus, such as a personal computer or a word processor, including the liquid crystal display element as a display section. The face of the interface circuit board PCB, on which the meshed pattern ERH shown in FIG. 25C is formed is joined and secured to the bottom of the bottom transparent glass substrate SUB1 by means of double-sided adhesive tape BAT.

The conductor layer comprises six conductor layers L1 to L6, in which L1 is used for a component pad, L2 is used for signal and ground, L3 is used for signal, L4 and L5 are used for power supply respectively, and L6 is used for ground, on which the meshed pattern ERH is formed.

<<Liquid crystal display element ASB having driver substrates>>

The liquid crystal display element ASB having driver substrates will be described below.

Figure 26A:
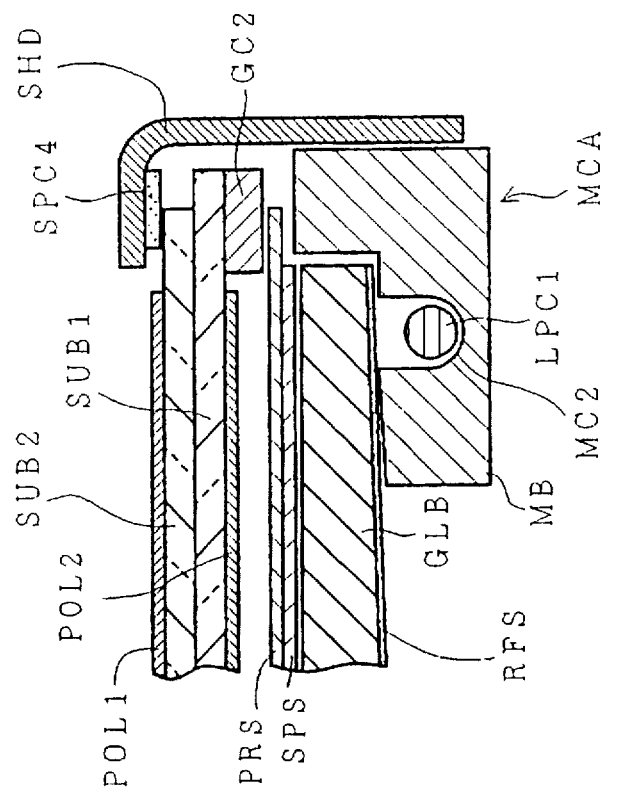
FIG. 26A is a sectional view of the assembled liquid crystal display module of FIG. 2A, taken along the line 26A—26A of FIG. 2

As shown in FIG. 26A, the drain driver flexible substrate FPC2 is folded and bonded to the face opposite to the pattern forming face of the transparent insulating substrate SUB1. Polarizing plates POL1 and POL2 are present slightly outside (approx. 1 mm) the effective pixel area AR, and an end of the FML of the substrate FPC2 is located approx. 1 to 2 mm away from the polarizing plate POL2. The distance from an end of the transparent insulating substrate SUB1 to the front end of the protruded folded portion of the FPC2 is as small as approx. 1 mm and compact mounting is realized. Therefore, in this embodiment, the distance from the effective pixel area AR to the front end of the protruded folded portion of the substrate FPC2 is approx. 7.5 mm.

A method for folding and mounting a flexible substrate will be described below.

Figure 22:
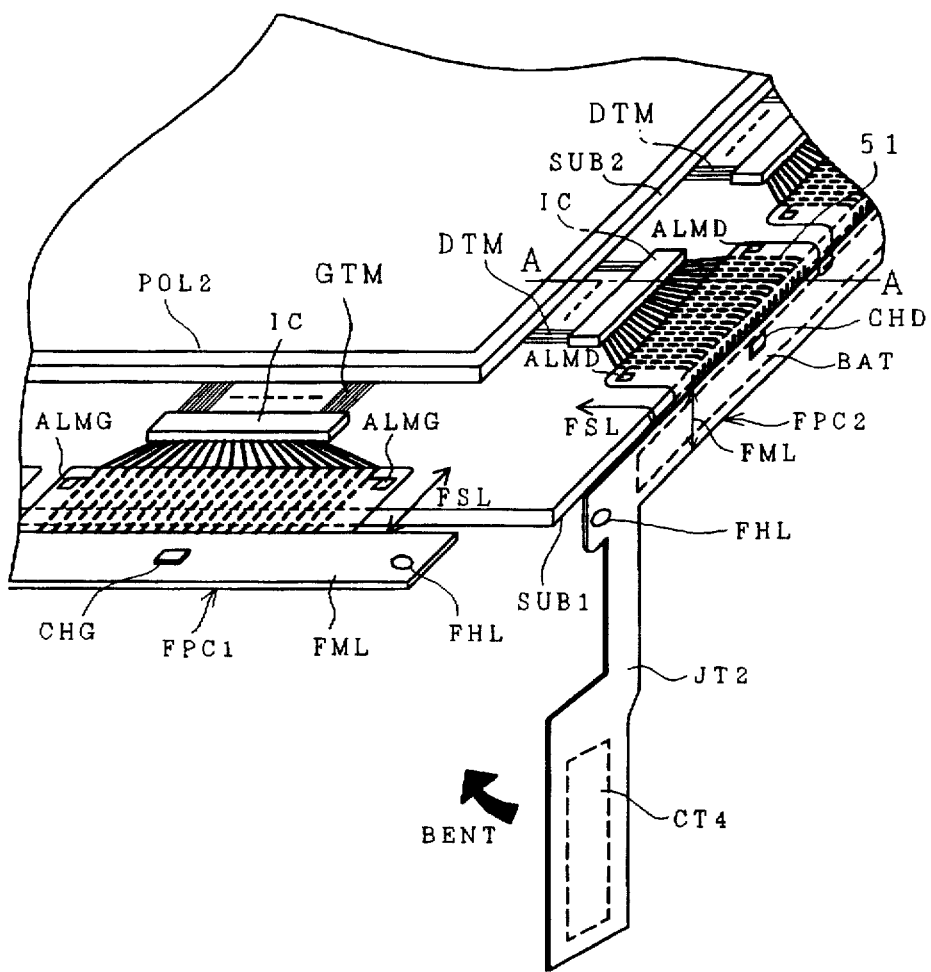
FIG. 22 is a perspective view showing how to fold and mount a foldable multilayer flexible substrate FPC2 and the joint between the multilayer flexible substrate FPC1 and FPC2.

FIG. 22 is a perspective view showing a method for folding and mounting a multilayer flexible substrate. The connection of the drain driver substrate FPC2 to the gate driver substrate FPC1 is achieved such that a flat connector CT4 provided at the front end of the projection JT2 and composed of a flexible substrate integrated with the substitute FPC2 is used as a joiner, is folded and electrically connected to the connector CT2 of the interface substrate PCB shown in FIG. 25A.

A double-sided adhesive tape BAT is stuck to a face of the conductor layer portion FML of the flexible substrate FPC2 where no component is mounted, and the flexible substrate FPC2 is folded with a jig.

The double-sided adhesive tape BAT used has a width of 3 mm and has a slender shape with a length of 160 to 240. However, it is possible to use any tape as long as the adhesiveness is ensured and it is also possible to stick a short piece of tape to several places. Moreover, it is possible to previously stick the double-sided adhesive tape BAT to the transparent insulating substrate SUB1 side.

As described above, it is possible to accurately fold the multilayer flexible substrate FPC2 by means of a jig and join it to the surface of the transparent insulating substrate SUB1.

<<Rubber cushion GC>>

Figure 26B:
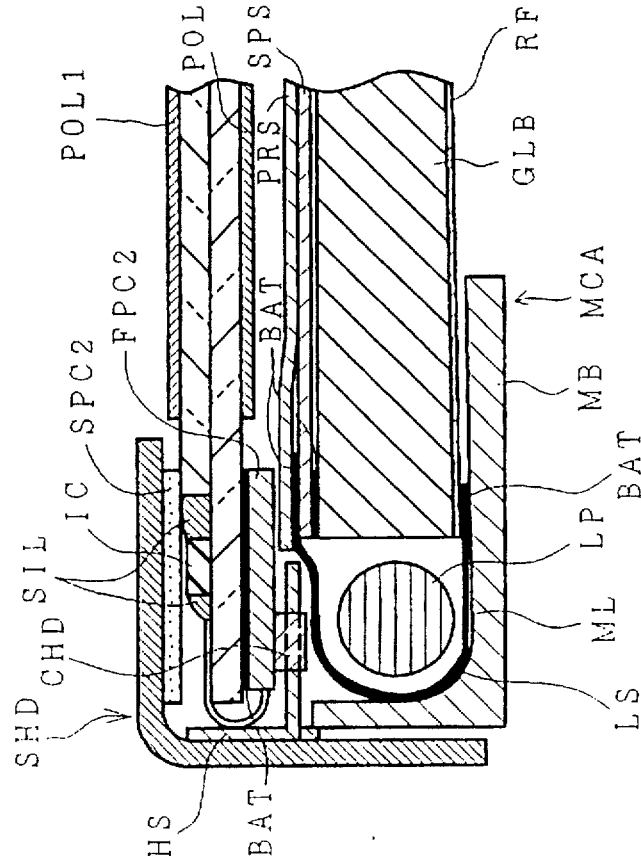
FIG. 26B is a sectional view of the module of FIG. 2A, taken along the line 26B—26B of FIG. 2A.

The rubber cushions GC1 and GC2 are shown in FIGS. 26B and 27B. The rubber cushions GC1 and GC2 are provided between the end bottom around the frame of the bottom transparent glass substrate SUB1 of the liquid crystal display element PNL and the bottom case MCA for housing the backlight BL through the prism sheet PRS. By using the elasticity of the rubber cushions GC1 and GC2, the shielding case SHD is pressed into the apparatus, the fixing hooks HK are caught on the fixing protrusion HP, the fixing pawls NL are bent and inserted into the fixing recesses NR, each fixing member functioning as a stopper, the shielding case SHD is fixed to the bottom case MCA, and the whole of the module is integrated and firmly held. Thus, other fixing members are unnecessary. Therefore, the apparatus can easily be assembled and the fabrication cost can be reduced. Moreover, because the apparatus has a strong mechanical strength and a high vibrational impact resistance, the reliability of the apparatus can be improved. Because the sides of each of the rubber cushions GC1 and GC2 are provided with an adhesive material respectively, they can be stuck to predetermined places on the substrate SUB1.

<<Backlight BL>>

FIG. 7 is a front view of the backlight BL, and FIG. 8 is a front view of the backlight BL from which the prism sheet PRS and the diffusion sheet SRS are removed. FIG. 9 is a front view of the backlight BL similar to the one shown in FIG. 8 showing another structure.

The side-light-type backlight BL for illuminating the liquid crystal display element PNL from the back comprises a cold cathode fluorescent tube LP, two lamp cables LPC1 and LPC2 of the fluorescent tube LP, two rubber bushes GB for holding the fluorescent tube LP and the lamp cables LPC, a light guide plate GLB, a diffusion sheet SPS arranged in contact with the whole top of the light guide plate GLB, a reflection sheet RFS arranged over the whole underside of the light guide plate GLB, and two prism sheets PRS arranged in contact with the whole top of the diffusion sheet SPS.

After the fluorescent tube LP is arranged on the reflection sheet LS, the reflection sheet LS is rounded and folded by 180° and ends of the sheet LS are stuck to the bottom of the light guide plate GLB by means of the double-sided adhesive tape BAT having an adhesive material (see FIG. 26A).

<<Diffusion sheet SPS>>

The diffusion sheet SPS is mounted on the light guide plate GLB to diffuse the light emitted from the top of the light guide plate GLB and uniformly illuminate the liquid crystal display element PNL.

<<Prism sheet PRS>>

The prism sheet PRS is mounted on the diffusion sheet SPS, whose underside is a smooth face and whose top is a prism face. The prism face comprises, for example, a plurality of grooves which are arranged like straight parallel lines and whose cross sections are V shaped (in other words, the prism face is formed by arranging a plurality of triangular prisms in parallel). The prism sheet PRS improves the luminance of the backlight BL by collecting the light diffused over a wide angle from the diffusion sheet SPS in the normal direction of the prism sheet PRS. Therefore, it is possible to reduce the power consumption of the backlight BL, resultingly decrease the module MDL in size and weight, and reduce the fabrication cost. When two prism sheets PRS are used, they are superposed on each other so that the extending directions of the grooves of the two prism sheets PRS are perpendicularly intersected.

<<Method for fixing diffusion sheet SPS and prism sheet PRS>>

Two small fixing holes whose positions coincide with each other when setting the diffusion sheet SPS and two prism sheets PRS serving as optical sheets are formed at ends of each side of the SPS and two PRS respectively. Correspondingly to the above, a pin-shaped protrusion MPN is provided at both ends of one side of the bottom case MCA manufactured by molding integrally with the case MCA. As shown in FIG. 8, the protrusion MPN is provided at the top and the bottom of the inverter housing portion MI of the backlight BL, one at each side of the bottom case MCA. The diffusion sheet SPS and the prism sheets PRS are fixed by passing the protrusion MPN through the small holes respectively and thereafter fitting a sleeve SLV (see FIG. 1) through which the protrusion MPN passes to the front end of the protrusion MPN respectively. The sleeve SLV is made of an elastic body such as silicone rubber. The inside diameter of the hole of the sleeve SLV is smaller than the outside diameter of the protrusion MPN so that the sleeve SLV does not easily come off.

Moreover, in this embodiment, another small hole is formed at ends of another side of each optical sheet in order to improve the position fixing accuracy so that the three pin-shaped protrusions MPN of the case penetrate the three holes.

Figure 11:
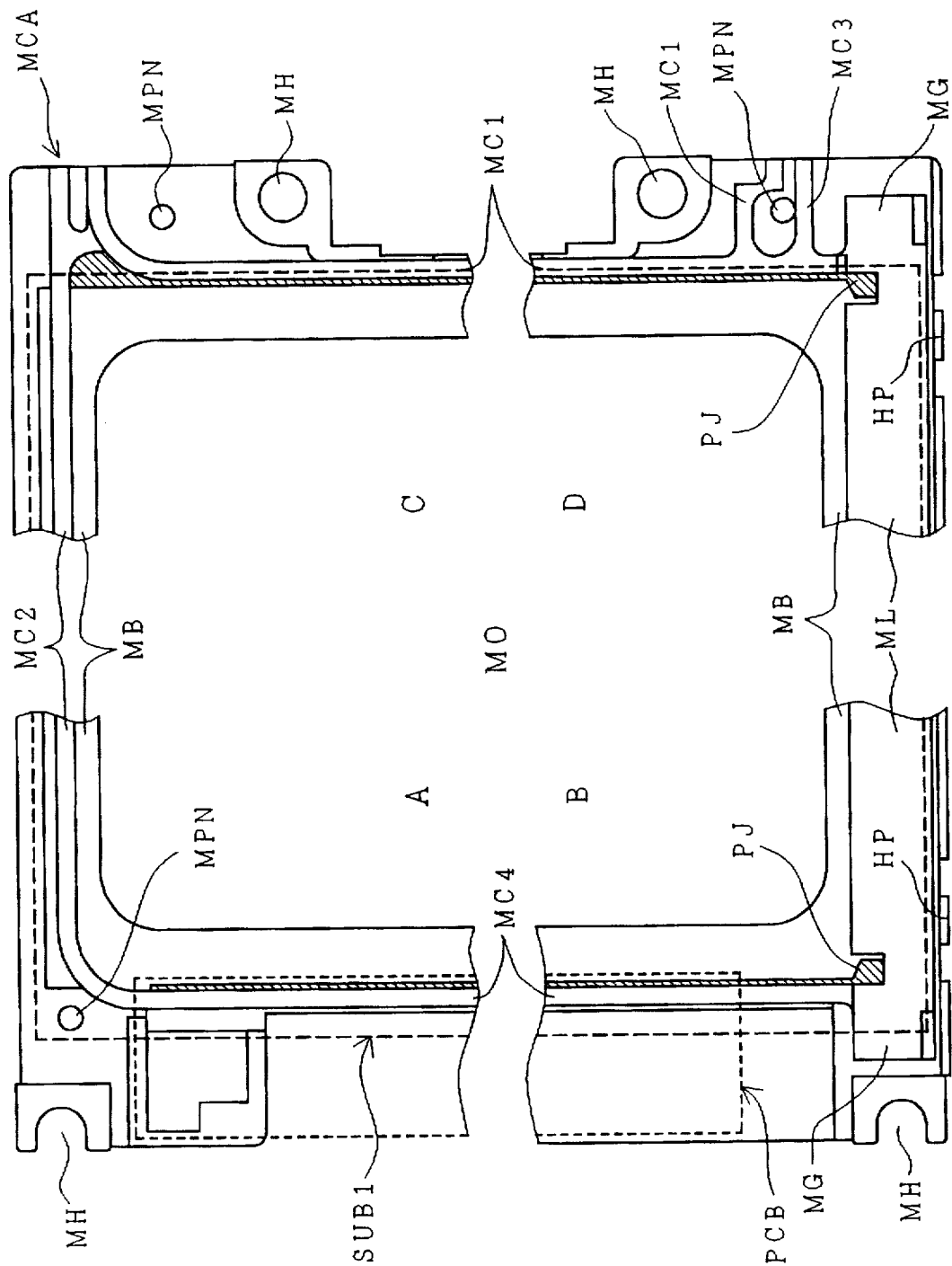
FIG. 11 is an enlarged detailed view of the portions A, B, C, and D of FIG. 10 (that is, the corners of the bottom case MCA)

FIG. 11 shows the two-dimensional relative positional relation between the transparent insulating substrate SUB1, the circuit board PCB, and the case MCA.

Position fixing is accurately performed with a total of three small holes by passing the pin-shaped protrusion MPN integrally formed at the ends of one side of the case through the additionally-provided small hole made in each optical sheet. The additional small hole and the pin-shaped protrusion MPN are arranged under the transparent insulating substrate SUB1 and inside the outer periphery of the SUB1 to reduce the size of the outline of the liquid crystal module. Because the pin-shaped protrusion MPN is located at a position where it is not overlapped with the circuit board PCB arranged under the gate-side flexible substrate FPC1, it is possible to form the MPN integrally with the case MCA without increasing the thickness of the liquid crystal module.

According to the above structure, positioning can be made accurately and easily because the workability of assembling the diffusion sheet SPS and the prism sheet PRS of the backlight is improved and the position is automatically determined in accordance with the combination of the protrusions MPN with the small holes. Moreover, it is possible to easily set or remove a predetermined sheet, replace only a defective sheet, and easily reuse (repair) sheets. As a result, the fabrication time can be decreased, the operability can be improved, and the prime cost can be reduced.

<<Reflection sheet RFS>>

The reflection sheet RFS is arranged under the light guide plate GLB to reflect the light emitted from the bottom of the light guide plate GLB toward the liquid crystal display element PNL.

<<Bottom case MCA>>

FIG. 10 is a front view, a front side view, a rear side view, a right side view, and a left side view of the bottom case MCA and FIG. 11 is an enlarged detailed view of the portions A, B, C, and D (that is, the corners of the bottom case MCA) of the front view of FIG. 10.

The bottom case MCA formed by molding is a member for holding the fluorescent tube LP, lamp cables LPC, and light guide plate GLB, that is, a backlight housing case, which is made through integral forming of a synthetic resin using one mold. Because the bottom case MCA is firmly combined with the metallic shielding case SHD by the actions of each fixing member and elastic body, it is possible to improve the vibrational impact resistance, thermal impact resistance, and reliability of the module MDL.

A large aperture MO occupying an area more than half the bottom area of the bottom case MCA is formed at the central portion of the bottom of the case MCA, except for the circumferential frame portion. Thereby, it is possible to prevent the bottom of the bottom case MCA from swelling due to a force vertically applied to the bottom of the case MCA from its top to bottom caused by repulsive force of the rubber cushions GC1 and GC2 (see FIGS. 26B and 27B) between the liquid crystal display element PNL and the bottom case MCA after the module MDL is assembled, and to control the maximum thickness. Therefore, the module MDL can be decreased in thickness and weight because it is unnecessary to increase the thickness of the bottom case to restrain the swelling thereof and it is possible to decrease the thickness of the bottom case.

The MCL in FIG. 10 is a notch (including a notch for connecting the connector CT1) formed in the bottom case MCA at a portion corresponding to a heat-generating component of the interface circuit board PCB, in this embodiment, a mounting portion of the hybrid-IC power supply circuit (DC—DC converter DD) shown in FIG. 5 and FIGS. 25A and 25B. Thus, by forming the notch, instead of covering the heat-generating portion on the circuit board PCB with the bottom case MCA, it is possible to improve the radiating characteristic of the heat-generating portion of the interface circuit board PCB. Moreover, it is possible to cut out the bottom case MCA on the display control integrated circuit device TCON because the TCON is considered to be a heat-generating component.

The MHs in FIG. 10 denote four mounting holes for mounting the module MDL on an application apparatus such as a personal computer. Because the mounting holes HLD coinciding with the mounting holes MH of the bottom case MCA are also formed on the metallic shielding case SHD, the module MDL is fixed to and mounted on an application product by using screws or the like.

The rubber bush GB holding the fluorescent tube LP and the rubber brush lamp cables LPC is fitted into a housing portion MG so formed that the GB is fitted and the fluorescent tube LP is housed in a housing portion ML without contacting the bottom case MCA.

In FIGS. 10 and 11, symbol MB denotes a portion for holding the light guide plate GLB and PJ denotes a positioning portion. ML denotes a portion for housing the fluorescent tube LP and MG denotes the portion for housing the rubber bush GB. MC1 to MC4 denote portions for housing the lamp cables LPC1 and LPC2.

<<Housing of light guide plate GLB in bottom case MCA>>

This embodiment is so constituted as to prevent the positioning portion (support frame) PJ of the bottom case MCA for housing and holding the light guide plate GLB of the backlight from being damaged.

Figure 12A:
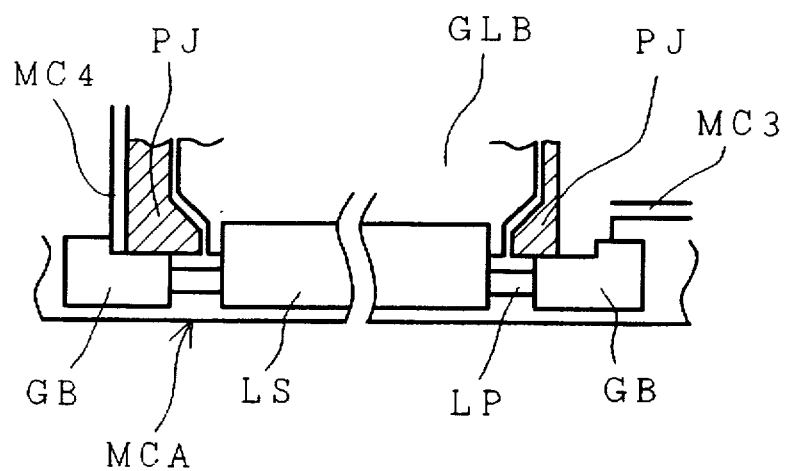
FIG. 12A is a top sectional view showing the light guide plate GLB and a corner of the positioning portion PJ of the bottom case MCA for housing and holding the light guide plate GLB.
Figure 12B:
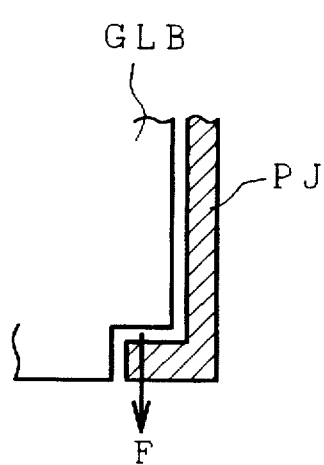
FIG. 12B is a sectional view showing how a force acts on the corner of the positioning portion PJ by a conventional light guide plate GLB.
Figure 12C:
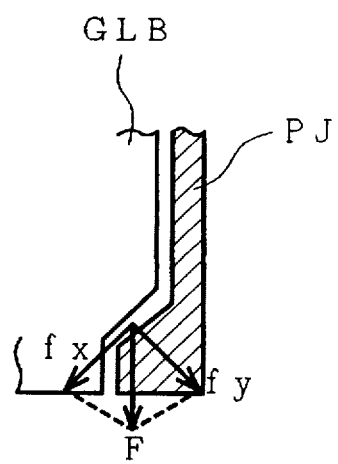
FIG. 12C is a sectional view showing how a force acts on the corner of the positioning portion PJ by the light guide plate of this embodiment.
Figure 13A:
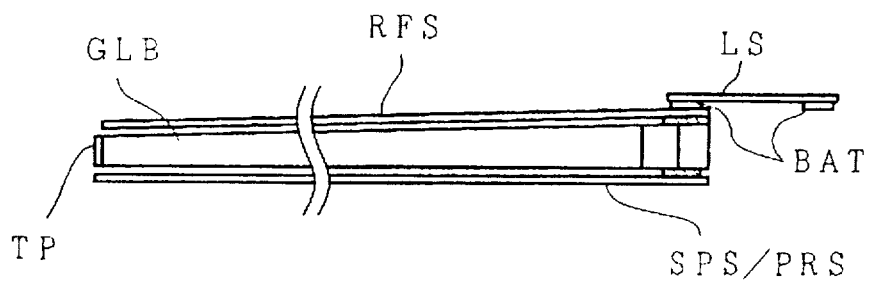
FIGS. 13A–13B show a top plan view and a side view of a backlight before folding a reflection sheet LS.
Figure 13B:
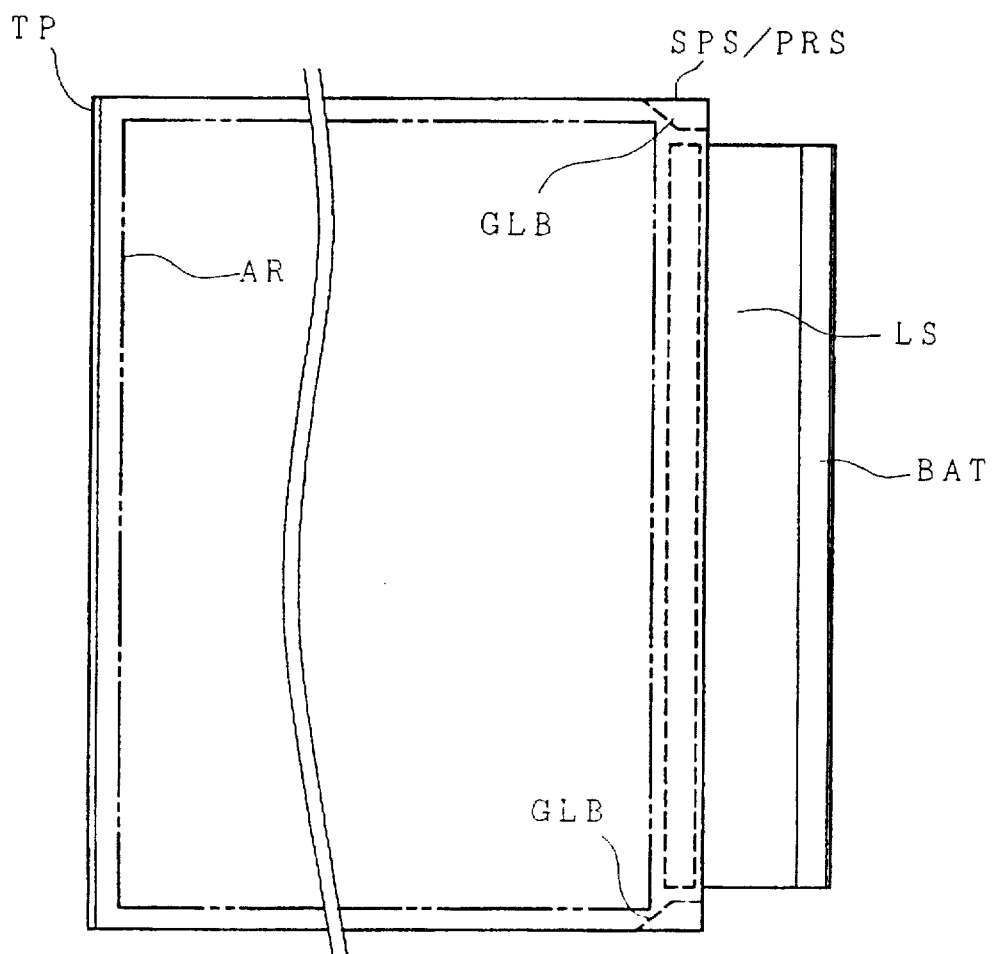

FIG. 12A is a front view showing the light guide plate GLB and the corner of the positioning portion PJ of the bottom case MCA for housing and holding the plate GLB, FIG. 12B is a front view showing how a force is applied when dropping the module MDL onto the lamp side at the corner of the positioning portion PJ of a conventional light guide plate GLB, and FIG. 12C is a front view showing how a force is applied at the corner of the positioning portion PJ of the light guide plate GLB of this embodiment.

As shown in FIG. 12A, a linear slope is formed by chamfering four corners of the light guide plate GLB and moreover, a linear slope is formed at each corner of the positioning portion PJ correspondingly to the slope of the light guide plate GLB. Conventionally, as shown in FIG. 12B, because the corners of the light guide plate GLB are at a right-angle and the corners of the positioning portion PJ are also at a right-angle, the light guide plate GLB is weak against a force F in the sideward direction. Therefore, when the light guide plate, which is particularly heavy member among the components of the liquid crystal display module, is moved in the module due to vibration or impact, the positioning portion PJ may be broken and, moreover, the lamp LP may be broken. In this embodiment, however, because a slope is formed on each corner of the light guide plate GLB and the positioning portion PJ, a force F applied to the positioning portion PJ is divided into two directional components $f_x$ and $f_y$ and can be decreased as x and y components even if the resultant of the components is equal as shown in FIG. 12C. Therefore, the impact applied to the positioning portion PJ of the bottom case MCA is decreased, the positioning portion PJ can be prevented from being damaged and the impact resistance and the reliability are improved.

<<Position where a cold cathode fluorescent tube LP is disposed>>

As shown in FIG. 26A, the slender fluorescent tube LP is arranged in a space (see FIG. 26A) under the drain-side flexible substrate FPC2 and the drain-side driving IC mounted on one of two long sides of the liquid crystal display element PNL in the module MDL. Thereby, because the outside dimensions of the module MDL can be decreased, it is possible to decrease the module MDL in size, weight, and fabrication cost.

Figure 35:
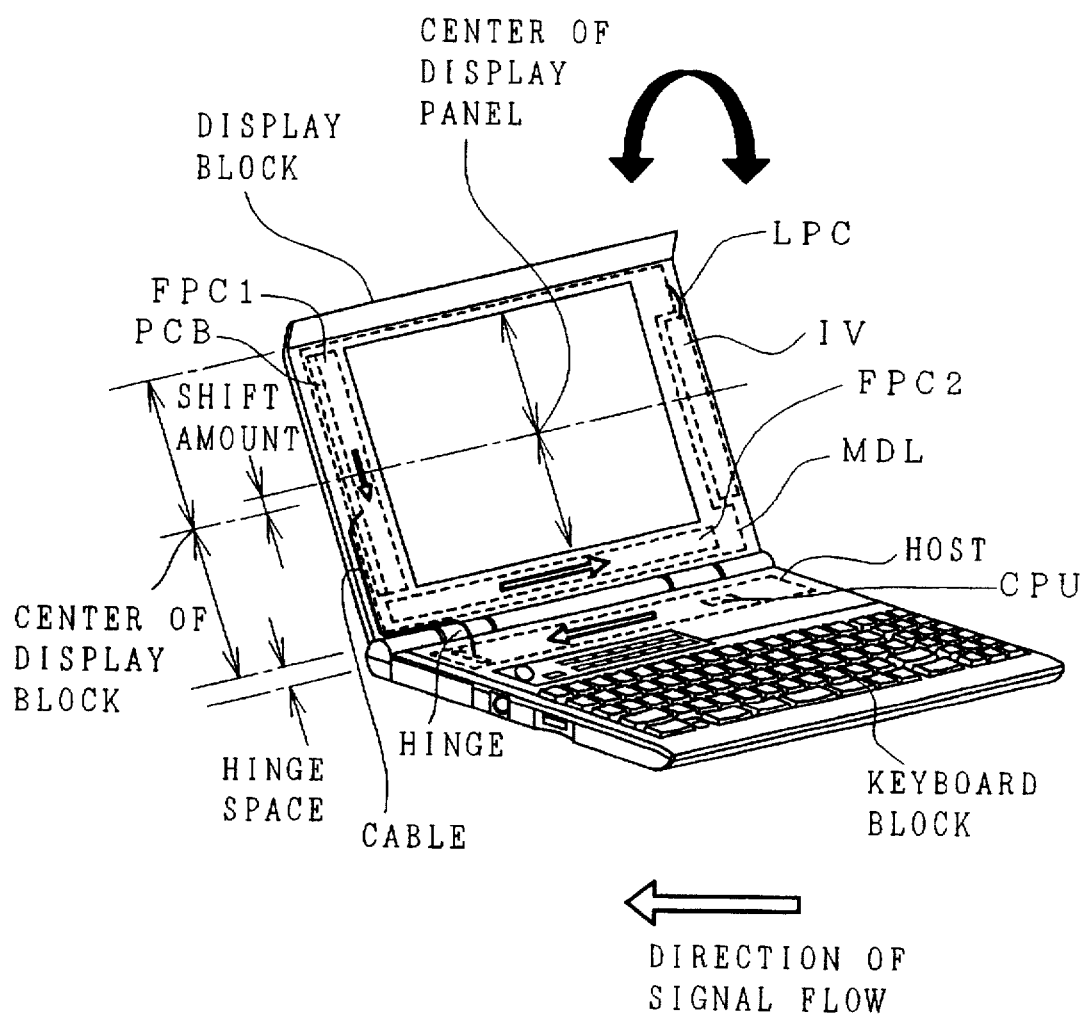
FIG. 35 is a perspective view of a notebook-type personal computer or word processor with a liquid crystal display module mounted on it.
Figure 36:
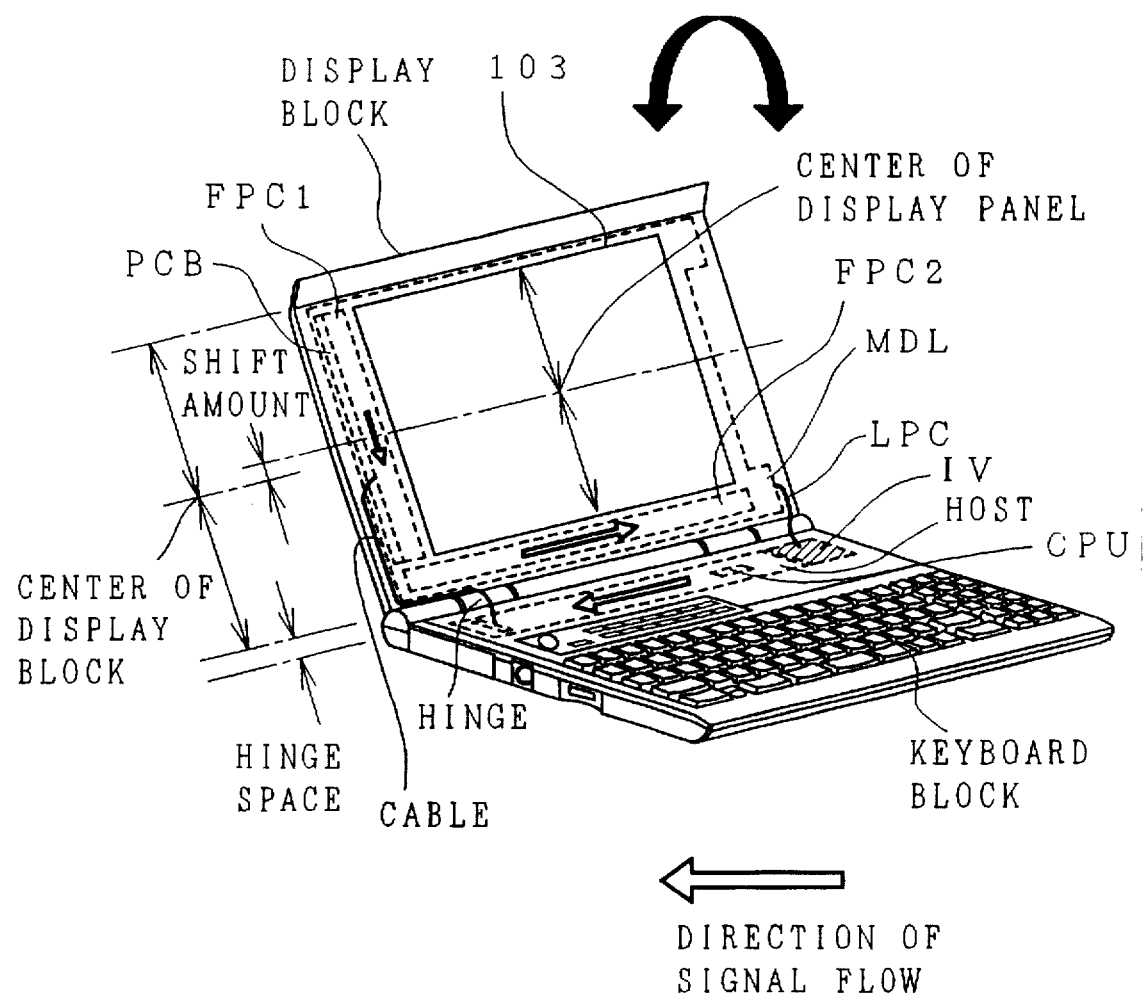
FIG. 36 is a perspective view of another notebook-type personal computer of word processor with a liquid crystal display module mounted on it.

Moreover, as shown in FIGS. 35 and 36, when incorporating the liquid crystal display module MDL into an information processing apparatus such as a personal computer or word processor as a display block, the MDL is arranged so that the cold cathode fluorescent tube LP is under the long side of the display block. The LPC2 is a high-voltage-side lamp cable to which a high voltage of approx. 1,100 V is applied and the LPC1 is a ground-voltage-side lamp cable. FIGS. 7 and 8 show an example in which an inverter IV is provided in the inverter housing portion MI in the display block. The lamp cable LPC1, as described later, is laid along two sides at the left and the top of the liquid crystal display module MDL, the lamp cable LPC2 is laid along one side at the right of the MDL, and both lamp cables LPC1 and LPC2 are led out of the top right of the MDL. In the example shown in FIG. 9, however, the inverter IV can also be provided in the keyboard block of an information processing apparatus, the lamp cable LPC1 is laid along the left, top, and right sides of the liquid crystal display module MDL, and both lamp cables LPC1 and LPC2 are led out of the bottom right of the MDL.

Thus, by installing the cold cathode fluorescent tube LP on the lower side of the display block of the liquid crystal display module MDL, it is possible to decrease the length of the lamp cable LPC2 of the high voltage side of the cold cathode fluorescent tube LP, reduce the impedance causing noise or changing waveforms, and improve the starting characteristic of the cold cathode fluorescent tube LP even if the inverter IV is set to the keyboard block of an information processing apparatus. When the inverter IV is provided on the keyboard block side, the width of the display block can be further decreased. Moreover, the reliability is improved because the cold cathode fluorescent tube LP does not easily receive impact due to opening or closing of the display block in FIGS. 35 and 36 compared to the arrangement in which the cold cathode fluorescent tube LP is installed on the upper side of the display block of the liquid crystal display module MDL. Furthermore, as shown in FIGS. 35 and 36, because the center of the liquid crystal display element PNL (display screen) is shifted upward from the center of the display block, it is possible to prevent the user from feeling difficulty in viewing the lower side of the display screen due to his hands operating the keyboard.

Furthermore, as shown in FIG. 26B, the vertical length can be decreased because the lamp cable LPC1 passes under the light guide plate GLB on the upper side of the display block.

<<Housing of lamp cable LPC in bottom case MCA>>

In this embodiment, the wiring of the lamp cables LPC is improved so as to produce a compact mounting and prevent bad influence on due to EMI noise.

FIG. 26B shows a sectional view of the liquid crystal display module MDL in FIG. 2, taken along the line B-B' of FIG. 2.

That is, as described above, in FIG. 8, the ground-voltage-side cable LPC1 of two lamp cables LPC is housed in the housing portions MC4 and MC2 comprising the grooves formed in the bottom case MCA along the outline of two sides, except for the housing portions of the fluorescent tube LP. The high-voltage-side cable LPC2 is laid short so as to be close to the portion at which the cable LPC2 is connected to the inverter power-supply circuit IV and is housed in the housing portion MC1 comprising the grooves formed in the bottom case MCA (see FIGS. 10 and 27B).

Moreover, in FIG. 9, the ground-voltage-side cable LPC1 is housed in the housing portions MC4, MC2, and MC1 (see FIG. 10) comprising the grooves formed in the bottom case MCA along the outline of three sides of the fluorescent tube LP, except for the housing portions.

The high-voltage-side cable LPC2 is laid short so as to be close to the keyboard block of an information processing apparatus in which the inverter IV is built and housed in the housing portion MC3 comprising the grooves formed in the bottom case MCA. Therefore, only the ground voltage wiring takes a long path, so that bad influence due to EMI noise is not inferior to the conventional case.

Therefore, the wiring area can be decreased by 1.5 to 2 mm because the lamp cable LPC1 is not present on the fluorescent tube LP side as shown in FIG. 26A compared to the conventional case where the lamp cables LPC1 and LPC2 are extended from one end of the fluorescent tube LP. In this embodiment, as shown in FIG. 26B, since the lamp cable LPC1 is arranged under the light guide plate GLB inside the transparent insulating substrate SUB1, the device is compactly designed.

Moreover, it is possible to install the fluorescent tube LP along the short side of the light guide plate GLB.

<<Planar and sectional structures nearby portion where driving IC chip is mounted>>

FIG. 19 is a top view showing the state wherein driving ICs are mounted, for example, on the transparent insulating substrate SUB1 made of glass. Moreover, FIG. 24 shows a sectional view of the driving IC mounted on the SUB1 of FIG. 19, taken along the line A—A of FIG. 19. In FIG. 19, the transparent insulating substrate SUB2 shown by a dash-and-dot line is put on the transparent insulating substrate SUB1 and the liquid crystal layer LC is sealed including the effective display block (effective screen area) AR. The electrode COM on the transparent insulating substrate SUB1 is the wiring electrically connected to a common electrode pattern on the transparent insulating substrate SUB2 side through conductive beads or silver paste. The wiring DTM (or GTM) supplies the output signal of the driving IC to the wiring in the effective display block AR. The input wiring Td supplies the input signal to the driving IC. The anisotropic conductive film ACF is so formed that the anisotropic conductive film ACF2 of a slender shape common to a plurality of lined-up driving ICs and the anisotropic conductive film ACF1 of a slender shape common to input wiring patterns for the driving ICs are separately attached. Passivation films (protective films) PSV1, shown also in FIG. 24 cover the wiring portion as wide as possible and the anisotropic conductive film ACF1 covers the exposed portions in order to protect them from electrolytic corrosion.

Moreover, the periphery of the sides of the driving ICs is filled with epoxy resin or silicone resin SIL (see FIG. 24) and multiply protected.

<<Driving waveform and peripheral circuit structure>>

Figure 33:
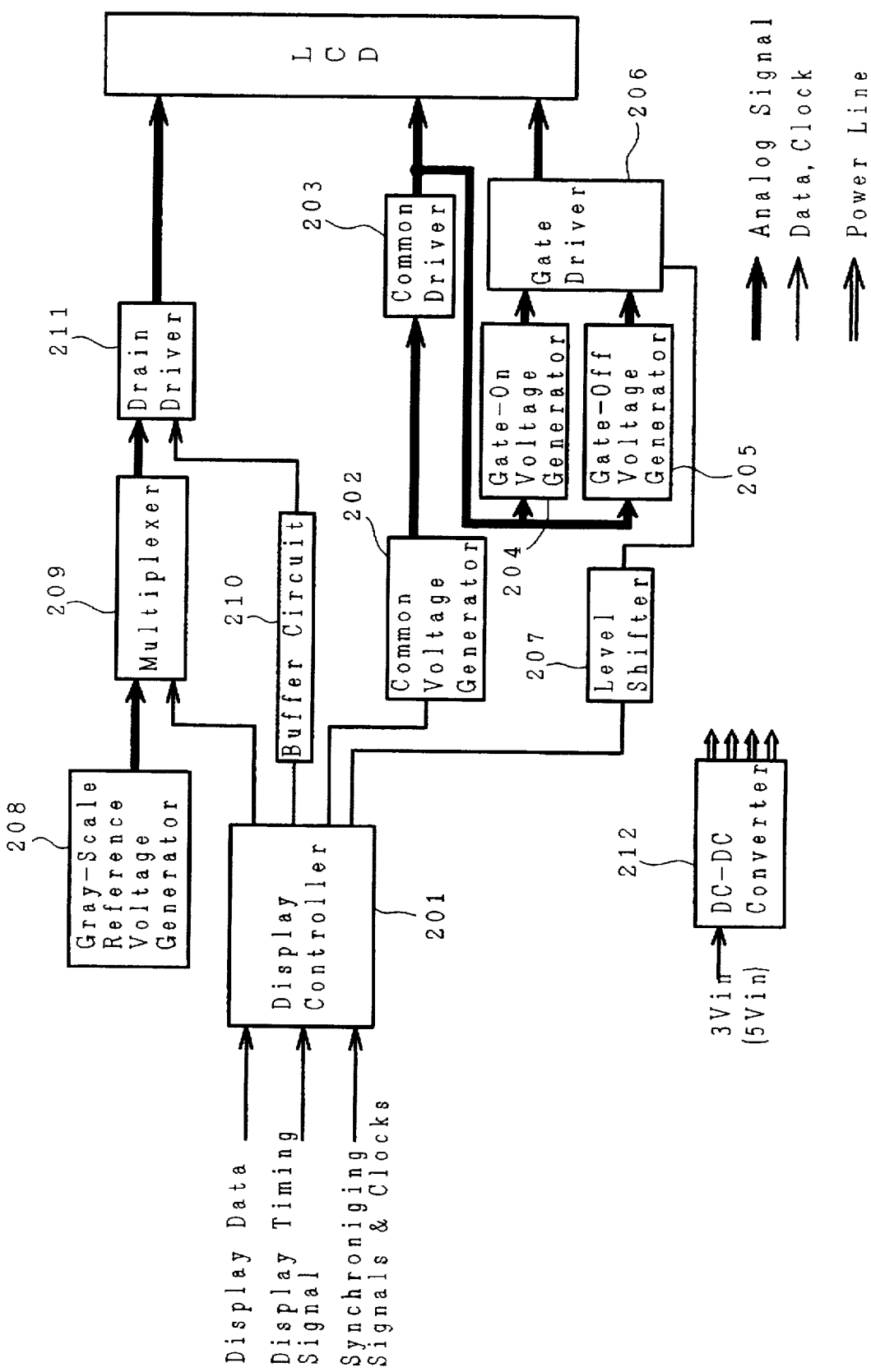
FIG. 33 is a block diagram showing a schematic structure of each driver and the flow of signals in a TFT liquid crystal display module.

FIG. 33 is a block diagram showing a schematic arrangement of drivers (drain driver, gate driver, and common driver) of the TFT liquid crystal display module of this embodiment and the flow of signals.

In FIG. 33, a display controller 201 and a buffer circuit 210 are provided in a controller unit 101 shown in FIG. 30, a drain driver 211 is provided in a drain driver unit 103 shown in FIG. 30, and a gate driver 206 is provided in a gate driver unit 104 shown in FIG. 30.

The drain driver 211 comprises a display data latching section and an output power generation circuit.

Moreover, a gray-scale reference voltage generator 208, a multiplexer 209, a common voltage generator 202, a common driver 203, a level shifter 207, a gate-on voltage generator 204, a gate-off voltage generator 205, and a DC—DC converter 212 are provided in a power supply unit 102 shown in FIG. 30.

Figure 32:
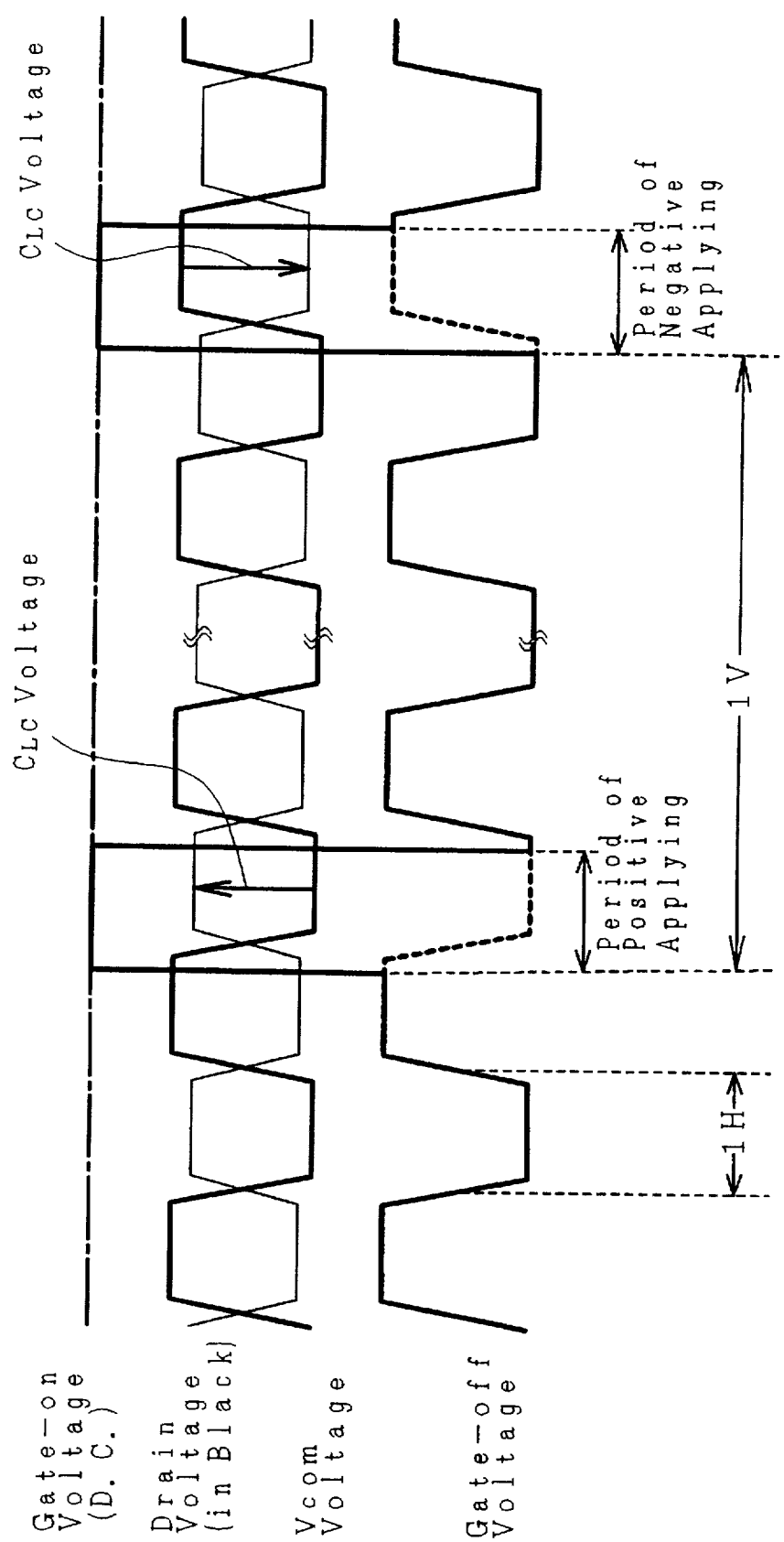
FIG. 32 is an a diagram showing levels and waveforms of a common voltage to be applied to a common electrode, a drain voltage to be applied to a drain electrode, and a gate voltage to be applied to a gate electrode in a TFT liquid crystal display module.

FIG. 32 shows the levels and waveforms of a common voltage applied to a common electrode, a drain voltage applied to a drain, and a gate voltage applied to a gate electrode.

A gate-off level waveform changes in level between –9 and –14 V and the gate turns on at 10 V. The drain waveform (during black display) and the common voltage Vcom waveform change in level between approx. 0 and 3 V. For example, to change the black-level drain waveform every horizontal period (1 H), the waveform is logic-inverted by a logical processing circuit one bit by one bit and is input to the drain driver. The gate-off level waveform changes with almost the same amplitude and phase as those of the common voltage Vcom.

Figure 31:
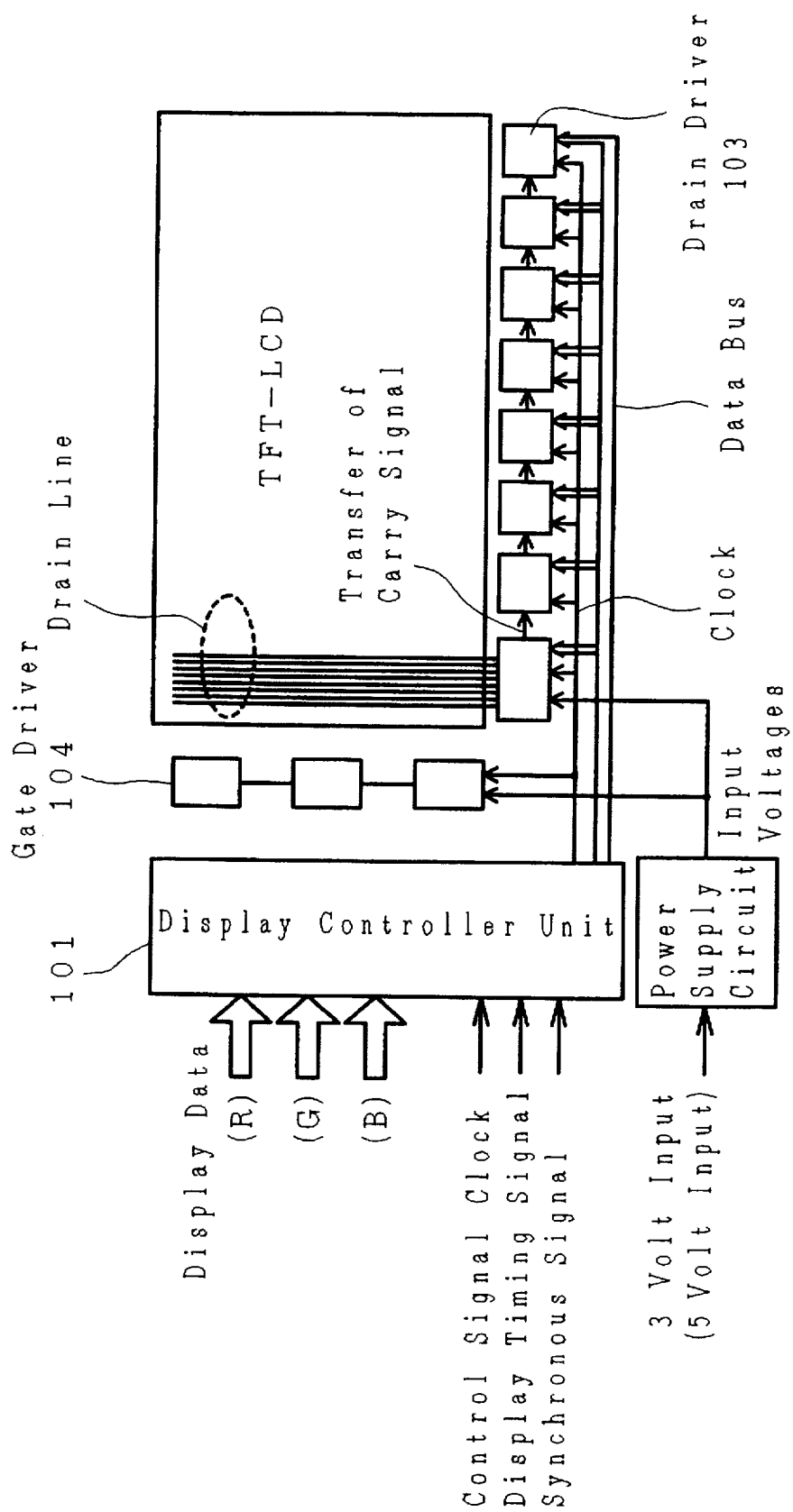
FIG. 31 is a diagram showing the flows of display data and clock signals from a display controller to gate and drain drivers in a TFT liquid crystal display module.

FIG. 31 is an illustration showing the flows of display data and clock signals for the gate driver 104 and the drain driver 103 in the TFT liquid crystal display module of this embodiment.

FIG. 34 is a timing chart showing display data input to the display controller 201 from the host computer and signals output to the drain and gate drivers from the display controller 201.

As obvious from FIG. 34, a clock signal D2 (CL2) for shifting the drain driver has the same frequency as that of a clock signal (DCLK) and display data input from the host computer. In the case of an XGA device, the frequency comes to a radio frequency of approx. 40 MHz and therefore, it is important to take measures against EMI.

The display controller 101 receives control signals (e.g. clock signal, display timing signal, and synchronous signal) and thereby, generates a clock signal D1 (CL1), a shift clock signal D2 (CL2), and display data as control signals for the drain driver 103 and simultaneously generates a frame start command signal FLM, and a clock signal G (CL3) as control signals for the gate driver 104.

The carry output of the present stage of the drain driver 103 is directly input to the carry input of the drain driver 103 at the next stage.

<<Information processing when mounting liquid crystal display module MDL>>

FIG. 35 and 36 are perspective views of a notebook-type personal computer or a word processor on which there is mounted a liquid crystal display module MDL. FIG. 35 shows an example where the inverter IV is housed in the display block, that is, the inverter housing portion MI of the liquid crystal display module MDL (see FIGS. 7 and 10) and FIG. 36 shows an example where the inverter IV is housed in the keyboard block of the MDL.

The outside size can greatly be reduced compared to the conventional size by COG-mounting driving ICs on the liquid crystal display element PNL, and using a multilayer flexible substrate for a peripheral circuit for drain and gate drivers at the periphery and moreover fold-mounting a drain-driver circuit. In this embodiment, compact mounting is realized because a drain-driver peripheral circuit mounted on one side can be arranged on the upper side of the display block above the hinges of an information apparatus.

In FIGS. 35 and 36, a signal from the information apparatus is first sent to the display control integrated circuit (TCON) from the connector located at the almost central portion of the left-side interface board PCB and then, the display data data-converted by the board PCB flows to the drain-driver peripheral circuit. Thus, by using a flip chip system and a multilayer flexible substrate, it is possible to eliminate the restriction of the external form of the width of an information apparatus and provide a compact information apparatus having less power consumption.

Though the present invention has been specifically described in accordance with an embodiment, it is not restricted to the disclosed embodiment. It is a matter of course that various modifications are allowed as long as they do not deviate from the gist of the present invention. For example, the above embodiment is an example where the present invention is applied to an active-matrix-type liquid crystal display device. However, it is also possible to apply the present invention to a simple-matrix-type liquid crystal display device. Moreover, the above embodiment is an example where the present invention is applied to a flip-chip-type liquid crystal display device. However, it is also possible to apply the present invention to liquid crystal display devices of other systems.

As described above, particularly when folding a driving multilayer flexible circuit board of a flip-chip-type liquid crystal display device, the present invention makes it possible to prevent disconnection of the wiring on the flexible board, fold the substrate at a high reliability, improve the assembling characteristic and the reliability of a backlight member, and moreover to improve the noise resistance. Therefore, it is possible to provide a liquid crystal display device which is advantageous is that it has a descreased size and thickness and an increased screen size.

We claim:

1. A liquid crystal display device comprising a flexible circuit board having a conductor layer, one end of which is connected to the surface of a wiring portion at an end of a liquid crystal display element, and an intermediate portion of which is folded, and whose other end is arranged on the lower or upper side of the end of said liquid crystal display element; wherein said flexible circuit board has at least said one conductor layer and two insulator film layers, and an end of one of the two insulator film layers of said flexible circuit board is formed into a repetitive pattern of waved or serrated portions having crests and troughs in the folding line direction.

2. The liquid crystal display device according to claim 1, wherein said liquid crystal display element is a flip-chip-type liquid crystal display element formed by mounting driving IC chips on the surface of a first of two insulating substrates, which are superposed on each other with a liquid crystal layer interposed therebetween and at least one of which is transparent, and wherein the flexible circuit board is connected to the surface of said wiring portion at an end of said first substrate, whose intermediate portion is folded nearby the outside of the end of said first substrate, and whose the other end is arranged under the other surface of said first substrate.

3. The liquid crystal display device according to claim 2, wherein said flexible circuit board has a multilayer wiring portion (FML) including two or more generally rectangular conductor layers and a plurality of protruding portions (FSL) protruded from said multilayer wiring portion and arranged at predetermined intervals, said protruded portions having one or two conductor layers, and said circuit board being connected to the surface of an end of the first substrate with an anisotropic conductive film at said protruded portions.

4. The liquid crystal display device according to claim 3, wherein a wave height distance between a crest and a trough of said waved or serrated pattern is a constant equal to or smaller than the, (thickness of said transparent insulating substrate×circle ratio)÷2.

5. The liquid crystal display device according to claim 3, wherein the length between said crests and the length between said troughs are constant and equal to or smaller than 1 mm.

6. The liquid crystal display device according to claim 3, wherein said flexible circuit board is a drain-line driving circuit board.

7. The liquid crystal display device according to claim 3, wherein the other end of said flexible circuit board and the other surface of said first substrate are bonded to each other with a double-sided adhesive tape.

8. A liquid crystal display device comprising a flip-chip-type liquid crystal display element formed by mounting a driving IC chip on the upper surface of a first of two insulating substrates which are superposed on each other with a liquid crystal layer interposed therebetween and at least one of which is transparent, a first printed circuit board arranged on the underside of an end of said first insulating substrate, and a second flexible circuit board connected to a wiring portion on the upper surface at an end of said first insulating substrate; wherein said second circuit board is superposed on said first circuit board when viewed from the direction vertical to the first insulating substrate and is electrically connected to said first circuit board with a flexible cable.

9. The liquid crystal display device according to claim 8, wherein said first printed circuit board is a first interface circuit board for supplying a power source voltage and image data information to the liquid crystal display element.

10. The liquid crystal display device according to claim 8, wherein said second flexible circuit board is a gate driver driving circuit board.

* * * * *